United States Patent
Abiko et al.

(10) Patent No.: US 8,203,885 B2
(45) Date of Patent: Jun. 19, 2012

(54) NONVOLATILE SEMICONDUCTOR MEMORY SYSTEM

(75) Inventors: Naofumi Abiko, Yokohama (JP); Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/178,718

(22) Filed: Jul. 8, 2011

(65) Prior Publication Data

US 2011/0267884 A1    Nov. 3, 2011

Related U.S. Application Data

(63) Continuation of application No. 12/630,220, filed on Dec. 3, 2009, now Pat. No. 8,009,480, which is a continuation of application No. 12/058,356, filed on Mar. 28, 2008, now Pat. No. 7,649,776.

(30) Foreign Application Priority Data

Mar. 30, 2007    (JP) ................................ 2007-094922

(51) Int. Cl.
  *G11C 16/04*    (2006.01)
(52) U.S. Cl. .......... 365/185.18; 365/185.11; 365/185.08
(58) Field of Classification Search ............. 365/185.18, 365/185.12, 185.08, 185.11, 185.17
See application file for complete search history.

(56) References Cited

U.S. PATENT DOCUMENTS

| | | | |
|---|---|---|---|
| 5,862,083 A | 1/1999 | Tobita et al. | |
| 6,574,147 B2 | 6/2003 | Tanaka et al. | |
| 7,248,493 B2 | 7/2007 | Takashima et al. | |
| 7,570,513 B2 | 8/2009 | Li et al. | |
| 2005/0036395 A1* | 2/2005 | Maejima et al. | 365/232 |
| 2005/0068802 A1 | 3/2005 | Tanaka | |
| 2006/0227624 A1 | 10/2006 | Shiga | |
| 2006/0274566 A1 | 12/2006 | Takashima et al. | |
| 2007/0253256 A1 | 11/2007 | Aritome | |

FOREIGN PATENT DOCUMENTS

JP    2006186359    7/2006

* cited by examiner

*Primary Examiner* — Huan Hoang
(74) *Attorney, Agent, or Firm* — Oblon, Spivak, McClelland, Maier & Neustadt, L.L.P.

(57) ABSTRACT

According to an embodiment, a nonvolatile semiconductor memory system includes: a nonvolatile semiconductor memory; and a memory controller having: a memory interface unit that inputs commands to the nonvolatile semiconductor memory and inputs or outputs data between the nonvolatile semiconductor memory; a memory that stores writing information indicating a memory cell transistor that is written the latest in each of the NAND cell units; and a processor that sets a read voltage based on the writing information to read out data from the memory cell transistors connected to a first word line; wherein a row controller is configured to set a plurality of levels of the read voltage to be applied to the first word line, with respect to one threshold for discriminating data stored in a memory cell transistors.

18 Claims, 29 Drawing Sheets

FIG. 7

| READ PAGE | CORRECTED PAGE OF READ VOLTAGE CONSIDERING THE EFFECT OF ERRONEOUS DATA PROGRAMMING DUE TO GIDL | | | |
|---|---|---|---|---|
| EVEN LOWER PAGE OF WL0 | ODD LOWER PAGE OF WL0 | ODD UPPER PAGE OF WL15 | ODD UPPER PAGE OF WL24 | |
| ODD LOWER PAGE OF WL0 | EVEN UPPER PAGE OF WL0 | ODD UPPER PAGE OF WL15 | ODD UPPER PAGE OF WL24 | |
| EVEN UPPER PAGE OF WL0 | ODD UPPER PAGE OF WL0 | ODD UPPER PAGE OF WL15 | ODD UPPER PAGE OF WL24 | |
| ODD UPPER PAGE OF WL0 | ODD UPPER PAGE OF WL15 | ODD UPPER PAGE OF WL24 | | |

NONVOLATILE SEMICONDUCTOR MEMORY SYSTEM

CROSS-REFERENCE TO RELATED APPLICATIONS

This application is a continuation of and claims the benefit of priority under 35 U.S.C. §120 from U.S. Ser. No. 12/630,220, filed Dec. 3, 2009, now U.S. Pat. No. 8,009,480 which is a continuation of application Ser. No. 12/058,356 filed Mar. 28, 2008 now U.S. Pat. No. 7,649,776 and claims the benefit of priority from Japanese Patent Application No. 2007-094922, filed Mar. 30, 2007, the entire contents of which are incorporated herein by reference.

BACKGROUND OF THE INVENTION

The present invention relates to a nonvolatile semiconductor memory, a control method of the nonvolatile semiconductor memory, a nonvolatile semiconductor memory system, and a memory card.

In the past, as a nonvolatile semiconductor memory device that is electrically rewritable and has a high integration density, a NAND-type flash memory is known. In the NAND-type flash memory, a NAND cell unit is constructed by a plurality of adjacent memory cells that are serially connected to each other in a form that source and drain regions are shared by the adjacent memory cells. Both ends of the NAND cell unit are connected to a bit line and a source line, respectively, via a select gate transistor.

The memory cell of the NAND-type flash memory includes a floating gate electrode formed on a semiconductor substrate via a tunnel insulating film, and a control gate electrode stacked on the floating gate electrode via an inter-gate insulating film, and stores data in a nonvolatile manner using the change of a threshold voltage based on the amount of charges accumulated on the floating gate electrode. Specifically, a high state of the threshold voltage in which electrons are injected to the floating gate electrode corresponds to data "0", and a low state of the threshold voltage in which electrons are discharged from the floating gate electrode corresponds to data "1", whereby two-value data can be stored for each state of the threshold voltage. In recent years, a technique has been developed to store multi-value data (having four values, for example) by subdividing the threshold voltage.

However, with the subdivision of the threshold voltage and with the decrease in the size of the memory cell, data is erroneously programmed, particularly, to the memory cell transistors adjacent to the select gate transistor. Thus, there was a problem that the reliability of the NAND-type flash memory decreases. To solve such a problem, a method has been proposed in which a dummy cell transistor that is not used to store data is provided next to the select gate transistor, which, however, was insufficient to prevent the decrease of reliability (see JP-A-2006-186359, for example).

SUMMARY OF THE INVENTION

According to an aspect of the present invention, there is provided a nonvolatile semiconductor memory system comprising: a nonvolatile semiconductor memory having: a plurality of NAND cell units having: a memory cell string that includes a plurality of memory cell transistors that are connected in series and capable of electrically rewriting data and storing data having two or more values represented by a threshold voltage thereof; a first select transistor that is connected between one end of the memory cell string and a source line; and a second select transistor that is connected between the other end of the memory cell string and a bit line, a plurality of word lines that are connected to a gate electrode of one of the memory cell transistors in each of the NAND cell units, the plurality of word lines including a first word line that is adjacent to the first select transistor; a first select gate line that is connected to a gate electrode of the first select transistor in each of the NAND cell units; a second select gate line that is connected to a gate electrode of the second select transistor in each of the NAND cell units; a row controller that selectively applies a read voltage to the word lines, the first select gate line, and the second select gate line; and a memory controller having: a memory interface unit that inputs commands to the nonvolatile semiconductor memory and inputs or outputs data between the nonvolatile semiconductor memory; a memory that stores writing information indicating a memory cell transistor that is written the latest in each of the NAND cell units; and a processor that sets a read voltage based on the writing information to read out data from the memory cell transistors connected to the first word line; wherein the row controller is configured to set a plurality of levels of the read voltage to be applied to the first word line, with respect to one threshold for discriminating the data stored in the memory cell transistors.

According to another aspect of the present invention, there is provided a nonvolatile semiconductor memory system comprising: a nonvolatile semiconductor memory having: a plurality of NAND cell units having: a memory cell string that includes a plurality of memory cell transistors that are connected in series and capable of electrically rewriting data and storing data having two or more values represented by a threshold voltage thereof; a first select transistor that is connected between one end of the memory cell string and a source line; and a second select transistor that is connected between the other end of the memory cell string and a bit line, a plurality of word lines that are connected to a gate electrode of one of the memory cell transistors in each of the NAND cell units, the plurality of word lines including a first word line that is adjacent to the first select transistor; a first select gate line that is connected to a gate electrode of the first select transistor in each of the NAND cell units; a second select gate line that is connected to a gate electrode of the second select transistor in each of the NAND cell units; a row controller that selectively applies a read voltage to the word lines, the first select gate line, and the second select gate line; and a memory controller having: a memory interface unit that inputs commands to the nonvolatile semiconductor memory and inputs or outputs data between the nonvolatile semiconductor memory; a memory that stores writing information including elapsed times since the latest writing in each of the NAND cell units; and a processor that sets a read voltage based on the writing information to read out data from the memory cell transistors connected to the first word line; wherein the row controller is configured to set a plurality of levels of the read voltage to be applied to the first word line, with respect to one threshold for discriminating the data stored in the memory cell transistors.

According to another aspect of the present invention, there is provided a nonvolatile semiconductor memory system including: a nonvolatile semiconductor memory having: a plurality of NAND cell units having: a memory cell string that includes a plurality of memory cell transistors that are connected in series and capable of electrically rewriting data and storing data having two or more values represented by a threshold voltage thereof; a first select transistor that is connected between one end of the memory cell string and a source line; and a second select transistor that is connected between the other end of the memory cell string and a bit line, a plurality of word lines that are connected to a gate electrode of one of the memory cell transistors in each of the NAND cell units, the plurality of word lines including a first word line that is adjacent to the first select transistor; a first select gate line that is connected to a gate electrode of the first select transistor in each of the NAND cell units; a second select gate line that is connected to a gate electrode of the second select transistor in each of the NAND cell units; a row controller that selectively applies a read voltage to the word lines, the first select gate line, and the second select gate line; and a memory controller having: a memory interface unit that inputs commands to the nonvolatile semiconductor memory and inputs or outputs data between the nonvolatile semiconductor memory; a memory that stores writing information includes elapsed times since the latest writing in each of the NAND cell units; and a processor that sets a read voltage based on the writing information to read out data from the memory cell transistors connected to the first word line; wherein the row controller is configured to set a plurality of levels of the read voltage to be applied to the first word line, with respect to one threshold for discriminating the data stored in the memory cell transistors, and wherein the memory controller copies data stored in one of the NAND cell units when the elapsed time calculated from the writing information with respect to the one of the NAND cell units exceeds a threshold time.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

FIG. 7 is an exemplary table showing a corrected page of a read voltage in the nonvolatile semiconductor memory system according to the first embodiment of the invention.

DETAILED DESCRIPTION OF THE PREFERRED EMBODIMENTS

Hereinafter, embodiments of the invention will be described with reference to the accompanying drawings.

First Embodiment

Figure 1:
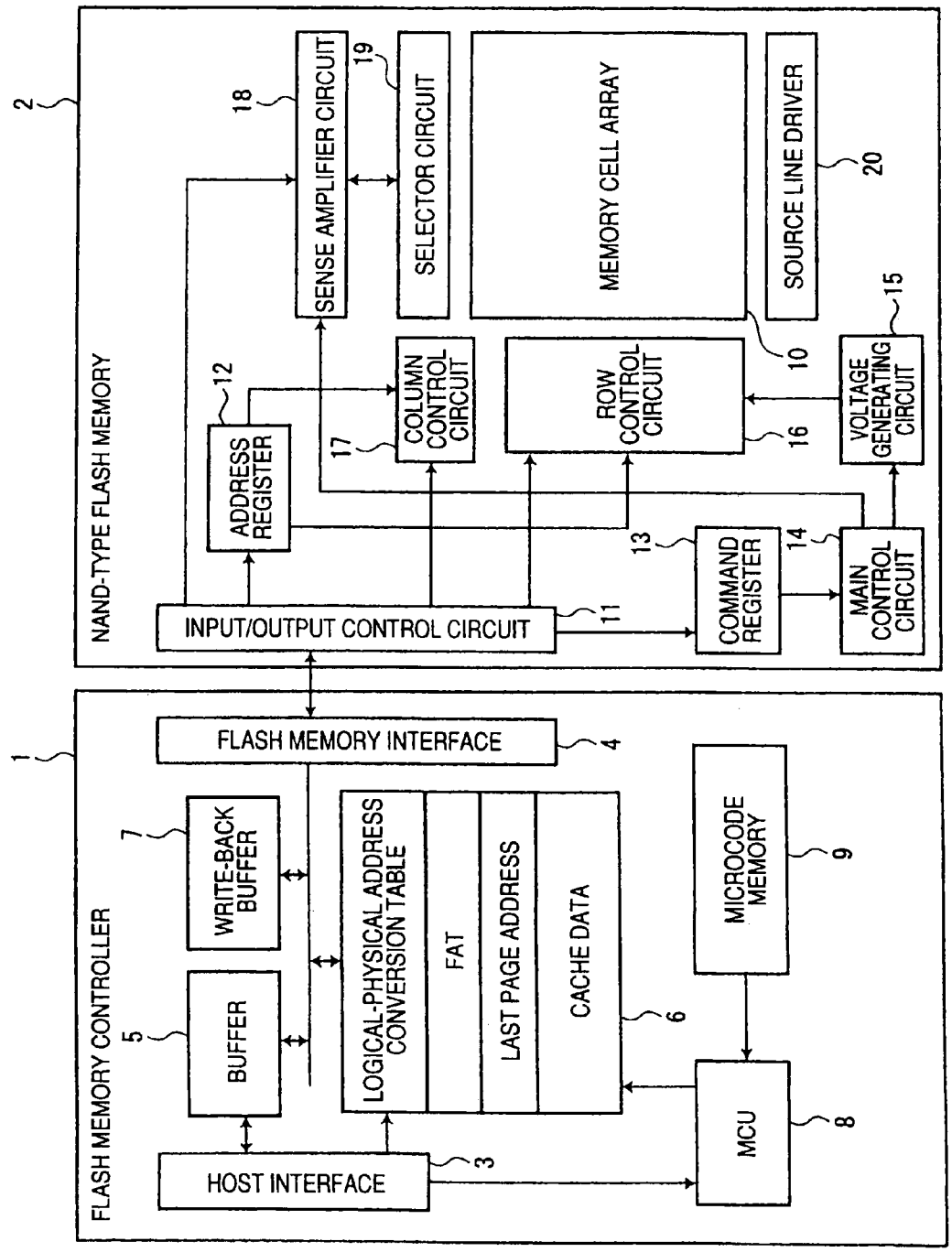
FIG. 1 is an exemplary block diagram showing the arrangement of a nonvolatile semiconductor memory system according to a first embodiment of the invention.

FIG. 1 is a block diagram showing the arrangement of a nonvolatile semiconductor memory system according to a first embodiment of the invention.

The memory system according to the present embodiment includes a flash memory controller (hereinafter referred to as a memory controller) 1 and a nonvolatile semiconductor memory, for example, a NAND-type flash memory 2, that is controlled by the memory controller 1.

The memory controller 1 includes a host interface 3, a flash memory interface 4, a buffer 5, a ferroelectric memory (hereinafter referred to as FeRAM (Ferroelectric Random Access Memory)) 6 as a storage portion, a write-back buffer 7, an MCU (Micro Control Unit) 8, and a microcode memory 9.

The host interface 3 interfaces between a host device (not shown) and the memory controller 1, and the flash memory interface 4 interfaces between the memory controller 1 and the NAND-type flash memory 2. Here, the host device means various electronic devices that control a memory system from the outside.

The buffer 5 is configured as FeRAM, for example, and is configured to temporarily store a predetermined amount of data when writing data transmitted from the host device (not shown) into the NAND-type flash memory 2 or to temporarily store a predetermined amount of data when transmitting data read from the NAND-type flash memory 2 to the host device.

The FeRAM 6 stores, for example, a logical-physical address conversion table that represents correspondence between a logical address designated by the host device and a physical address within the NAND-type flash memory 2, a FAT (File Allocation Table) that represents chain information of a file stored in the NAND-type flash memory 2, and a last page address described later. The FeRAM 6 can perform a higher speed operation compared with the NAND-type flash memory 2. Therefore, such data that are expected to be frequently accessed are not stored in the NAND-type flash memory 2 but in the FeRAM 6, and the operation speed of the memory system is improved.

A partial area of the FeRAM 6 is used as a nonvolatile cache. That is, during data read operations, data is copied to the FeRAM 6, and this data is also read into the host device via the buffer 5. Since the information of a logical address that is once read is already stored in the FeRAM 6, the second and later read operations are performed at high speed.

The write-back buffer 7 is configured as FeRAM, for example. When the cache area within the FeRAM 6 is highly utilized, the write-back buffer 7 writes back data into the NAND-type flash memory 2. Such data write-back is preferably performed in ascending order of the frequency the data is accessed.

The MCU 8 controls the overall operation of the memory controller 1 that includes the host interface 3, the flash memory interface 4, the buffer 5, the FeRAM 6, and the write-back buffer 7, and performs a computational process described later.

The microcode memory 9 stores a command code or the like of the MCU 8.

Figure 2:
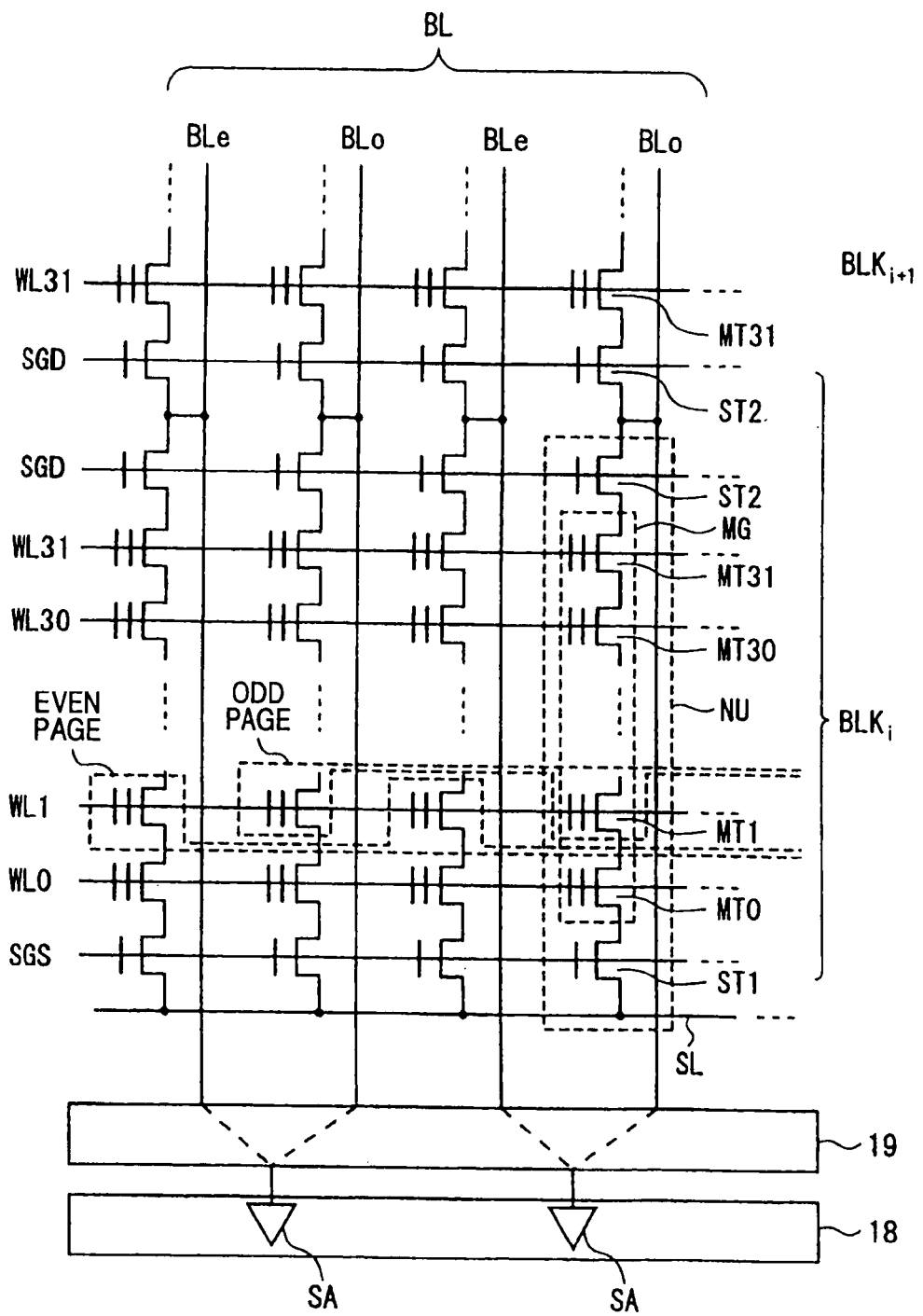
FIG. 2 is an exemplary circuit diagram showing an equivalent circuit of a memory cell array of the nonvolatile semiconductor memory system according to the first embodiment of the invention.

The NAND-type flash memory 2 includes a memory cell array 10, an input/output control circuit 11, an address register 12, a command register 13, a main control circuit 14, a voltage generating circuit 15, a row control circuit 16, a column control circuit 17, a sense amplifier circuit 18, a selector circuit 19, and a source line driver 20. FIG. 2 shows an equivalent circuit of the memory cell array 10. Hereinafter, the memory cell array 10 will be described with reference to FIGS. 1 and 2.

As shown in FIG. 2, the memory cell array 10 includes a block BLK, in which a plurality of NAND cell units NU is arranged each having a memory cell group MG that is serially connected to a plurality of memory cell transistors MT of which the data can be distinguished by the number of electrons stored in a floating gate electrode FG described later, a first select transistor ST1 that is connected between one end of the memory cell group MG and a source line SL, and a second select transistor ST2 that is connected between the other end of the memory cell group MG and a bit line BL. The memory cell array 10 includes a plurality of blocks $BLK_i$, $BLK_{i+1}$, $BLK_{i+2}$, . . . , and so on. These blocks $BLK_i$, $BLK_{i+1}$, $BLK_{i+2}$, . . . , and so on have the same structure, and hereinafter, only a specific block BLK will be described. The memory cell array 10 includes 2048 blocks BLK, for example. A data erase operation is performed in units of a block BLK, and data program and read operations are performed in units of a page, described later.

Within the block BLK, each memory cell group MG that constitutes the NAND cell unit NU includes 32 memory cell transistors MT0 to MT31 (hereinafter, sometimes generally referred to as a memory cell transistor MT). Between adjacent NAND cell units NU, 32 word lines WL0 to WL31 (hereinafter, sometimes generally referred to as a word line WL) that commonly connect gate electrodes of the memory cell transistors MT on the same row, a first select gate line SGS that commonly connects gate electrodes of the first select transistors ST1, and a second select gate line SGD that commonly connects gate electrodes of the second select transistors ST2 are wired.

The input/output control circuit 11 transmits and receives signals to and from the outside of the NAND-type flash memory 2. For example, the input/output control circuit 11 transmits data, addresses, and various commands, input from the memory controller 1, to the sense amplifier circuit 18, the address register 12, and the command register 13, respectively.

The address register 12 latches addresses input via the input/output control circuit 11 to transmit column addresses to the column control circuit 17 and row and block addresses to the row control circuit 16.

The command register 13 latches the various commands input via the input/output control circuit 11 to transmit them to the main control circuit 14.

The row control circuit 16 functions as a block decoder decoding the block addresses sent from the address register 12 to select a specific block BLK within the memory cell array 10, functions as a row decoder decoding the row address, and functions as a gate line driver controlling application voltages to the plurality of word lines WL, the first select gate line SGS, and the second select gate line SGD within the block BLK according to the decoded row address.

The column control circuit 17 decodes the column addresses sent from the address register 12 to set program data for each column address to the sense amplifier circuit 18.

The sense amplifier circuit 18 includes a plurality of sense amplifiers SA. The sense amplifier circuit 18 is selectively connected via the selector circuit 19 to an even bit line BLe, a set of even-numbered bit lines BL when counted from the end of the bit lines BL within the block BLK, or to an odd bit line BLo, a set of odd-numbered bit lines BL, and detects the potential of the even bit line BLe or the odd bit line BLo to store the detected potential in a data cache.

The selector circuit 19 selects one of the two bit line BL groups and connects the selected group to the sense amplifiers SA, and the other group of the two bit line BL groups is not selected and is not connected to the sense amplifiers SA. During data read operations, the non-selected bit lines BL are grounded to decrease the coupling noise between bit lines.

The source line driver 20 applies voltages to the source line SL.

The voltage generating circuit 15 generates high voltages, such as a program voltage $V_{pgm}$, a program pass voltage $V_{pass}$, a read voltage $V_{select}$, and a read pass voltage $V_{read}$, required for the row control circuit 16 under the control of the main control circuit 14.

The main control circuit 14 controls operations such as program, read, or erase base on the commands sent from the command register 13. For example, during the program operations, the main control circuit 14 controls a voltage required for the program operations, timings of a program voltage $V_{pgm}$ applying operation and timings of a verify read operation described later and repeats the program voltage $V_{pgm}$ applying operation and the verify read operation until a desired program operation is finished.

In the memory cell array 10 according to the present embodiment, a set of the memory cell transistors MT that are selected by one word line WL and the even bit line BLe within the block BLK constitutes one page (even page) as a unit of program and read operations, and a set of the memory cell transistors MT that are selected by the one word line WL and the odd bit line BLo constitutes another one page (odd page).

Each of the memory cell transistors MT can store one of 4-value data "xy" which is defined by upper page data "x" and lower page data "y" and in which in the order of a threshold voltage, data "E"="11", data "A"="01", data "B"="00", and data "C" (data "LM")="10" are assigned. That is, the upper and lower pages of the above-described even and odd pages are assigned. Therefore, for one word line WL, four pages, that is, the lower page of the even page (hereinafter, referred to as an even lower page), the lower page of the odd page (hereinafter, referred to as an odd lower page), the upper page of the even page (hereinafter, referred to as an even upper page), and the upper page of the odd page (hereinafter, referred to as an odd upper page) are assigned.

Figure 3:
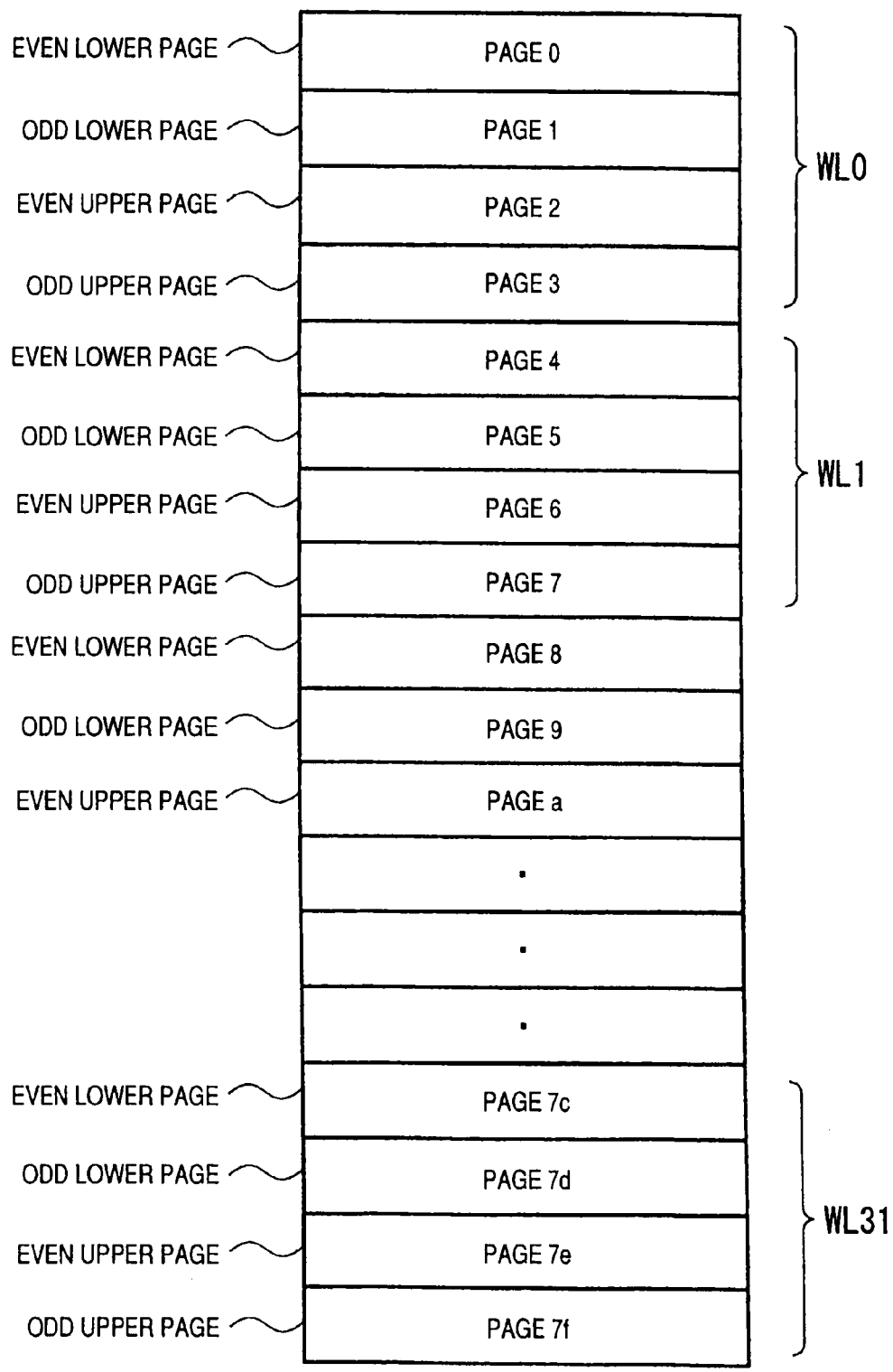
FIG. 3 is an exemplary block diagram showing a page arrangement within a block of the memory cell array of the nonvolatile semiconductor memory system according to the first embodiment of the invention.

Next, the data program operation in the memory system according to the present embodiment will be described. The programming of data in the block BLK of the memory cell array 10 is sequentially performed from the word line WL closest to the source line SL in the block BLK, i.e., word line WL0 (a first word line) adjacent to the first select gate line SGS, to word line WL31 (a second word line) adjacent to the second select gate line SGD. For one word line WL, the programming of data is performed in the order of the even lower page, the odd lower page, the even upper page, and the odd upper page. To each page in the block BLK, as shown in FIG. 3, page numbers from page 0 to page 7f are assigned corresponding to the order of programming. FIG. 3 is a conceptual diagram showing a page arrangement within the block BLK.

For example, in word line WL0, page 0 corresponds to the even lower page, page 1 corresponds to the odd lower page, page 2 corresponds to the even upper page, and page 3 corresponds to the odd upper page. Outside the memory system, different logical addresses are assigned to each of these pages. Hereinafter, a word line WL corresponding to the page subjected to the data program and read operation will be referred to as a selected word line WL, and the case will be described in which data is programmed into the memory cell transistor MT connected to the selected word line WL.

During a program operation for programming data into the memory cell transistor MT connected to the selected word line WL, the row control circuit 16 applies a program voltage $V_{pgm}$ of about 20 V, for example, to the selected word line WL and a program pass voltage $V_{pass}$ ($<V_{pgm}$) of about 10 V, for example, to a non-selected word line WL. The program pass voltage $V_{pass}$ is a voltage that turns on the memory cell transistor MT without regard to the data stored during the program operation. The first select gate line SGS is applied with 0 V, and the second select gate line SGD and the source line SL are applied with $V_{dd}$. In the invention, $V_{dd}$ is a voltage that turns on the second select transistor ST2 and is set to about 2 V, for example.

The bit line BL connected to the NAND cell unit NU that includes the memory cell transistor MT to which data is to be programmed is applied with 0 V. The first select transistor ST1 is in the OFF state and the second select transistor ST2 is in the ON state. The non-selected word line WL is applied with the program pass voltage $V_{pass}$. Therefore, a voltage of 0 V on the bit line BL is transferred to the channel of the memory cell transistor MT subjected to the programming. The selected word line WL is applied with the program voltage $V_{pgm}$. Therefore, electrons are injected to the floating gate electrode FG of the memory cell transistor MT and data is programmed into the memory cell transistor MT.

On the other hand, the bit line BL connected to the NAND cell unit NU that includes the memory cell transistor MT to which data is not to be programmed is applied with $V_{dd}$. The first select transistor ST1 and the second select transistor ST2 are all in the OFF state. Therefore, the memory cell group MG is in an electrically floating state. As a result, the channel potential of the memory cell transistor MT increases due to the coupling of the selected word line WL and the non-selected word line WL. With this, electrons are not injected to the floating gate electrode FG of the memory cell transistor MT connected to the selected word line WL applied with the program voltage $V_{pgm}$ and data is not programmed into the memory cell transistor MT.

Figure 4:
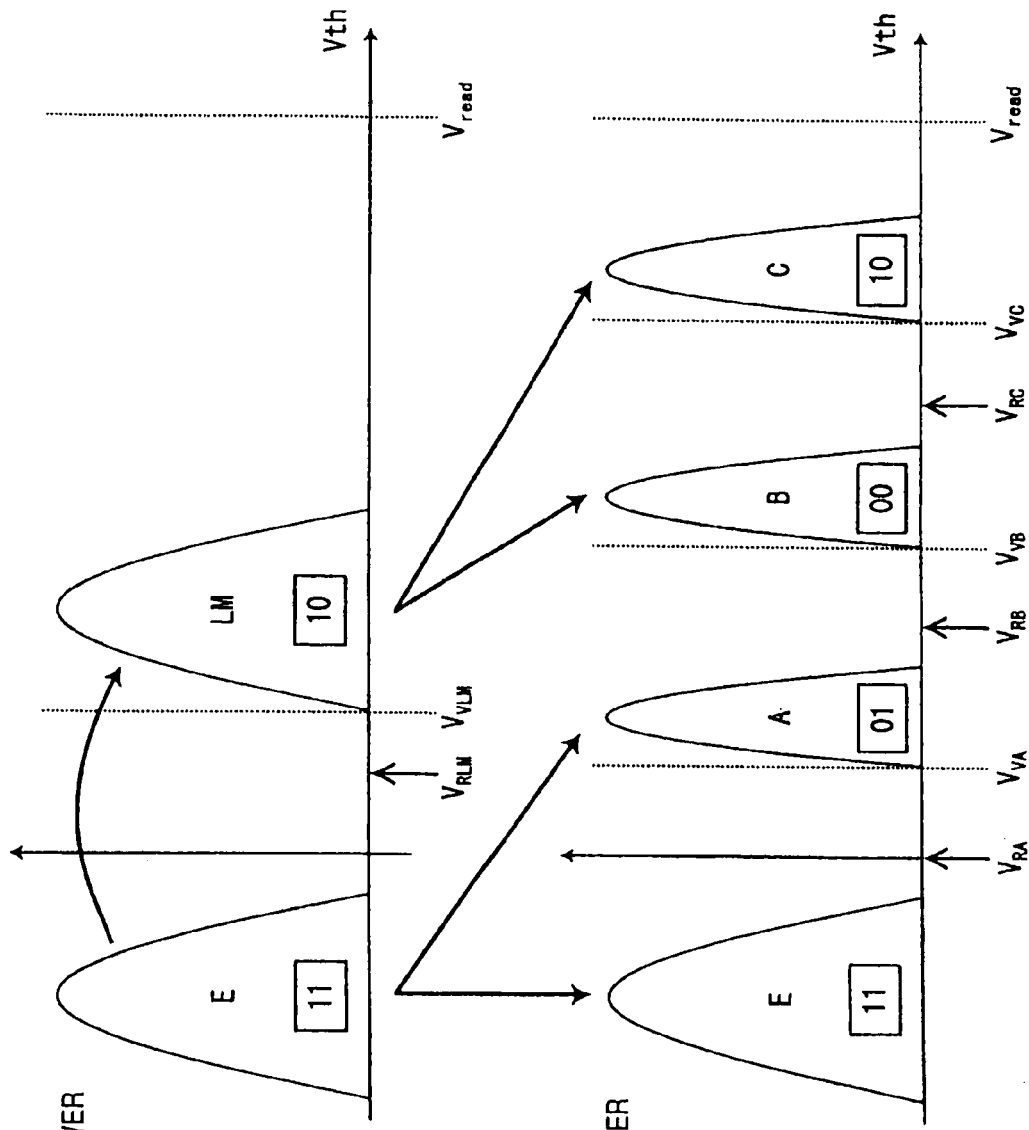
FIG. 4 is an exemplary schematic diagram showing a threshold distribution of 4-value data stored in a memory cell transistor MT in the nonvolatile semiconductor memory system according to the first embodiment of the invention.

The program operation includes a lower page program operation and an upper page program operation. Hereinafter, the lower page program operation and the upper page program operation will be described with reference to FIG. 4. FIG. 4 is a schematic diagram showing a threshold distribution of 4-value data stored in the memory cell transistor MT of the nonvolatile semiconductor memory system according to the present embodiment.

During the lower page program operation, intermediate data "LM" (data "10") having a threshold distribution ranging between the threshold distribution of data "A" and the threshold distribution of data "B" is selectively programmed into the memory cell transistor MT having data "E" (erased state) stored therein. The intermediate data "LM" has a threshold voltage lower limit $V_{VLM}$ lower than the threshold voltage lower limit $V_{VB}$ of data "B" and higher than the threshold voltage lower limit $V_{VA}$ of data "A" and has a threshold distribution broader than that of data "C" which corresponds to data "10" after the upper page is programmed.

During the upper page program operation, "0" is selectively programmed into the memory cell transistor MT having data "E" stored therein to program data "A" having the threshold voltage lower limit $V_{VA}$. In addition, "0" is programmed into the memory cell transistor MT having the intermediate data "LM" having a broad threshold distribution stored therein to program data "B" having the threshold voltage lower limit $V_{VB}$. In addition, when programming "1" (i.e., when storing data "10") into the memory cell transistor MT having the intermediate data "LM" stored therein, the threshold distribution is changed up to data "C" having the threshold voltage lower limit $V_{VC}$.

The above-described program operation is performed in several steps accompanied by a method called a verify-read operation. During the verify read operation, the selected word line WL is applied with a verify voltage corresponding to the threshold voltage lower limit of the data of the memory cell transistor MT after the program operation is finished, and the sense amplifier SA detects whether the precharged bit line BL is discharged via the memory cell transistor MT.

Since the memory cell transistor MT to which the programming is performed is not turned on by the verify voltage applied to the selected word line WL, the potential of the bit line BL is not discharged. To the contrary, since the memory cell transistor MT to which the programming is insufficiently performed is turned on by the verify voltage applied to the selected word line WL, the potential of the bit line BL is discharged. The memory cell transistor MT to which the programming is performed is not subjected to a subsequent programming. The memory cell transistor MT to which the programming is insufficiently performed is subjected to a subsequent programming by increasing the program voltage $V_{pgm}$ to be applied to the selected word line WL by a predetermined value. When the threshold voltage of the entire memory cell transistors MT to which data is to be programmed reaches the verify voltage, the program operation is finished. With this, a sharp threshold distribution having a narrow width is obtained.

Next, a data read operation in the memory system according to the present embodiment will be described. During the read operation, the row control circuit 16 applies a read voltage $V_{select}$ to the selected word line WL and a read pass voltage $V_{read}$ of about 5 V to the non-selected word line WL. The read pass voltage $V_{read}$ is a voltage that turns on the memory cell transistor MT without regard to the data stored during the read operation. The first select gate line SGS and the second select gate line SGD are applied with $V_{dd}$.

At that time, the sense amplifier SA detects whether the precharged bit line BL is discharged via the selected memory cell transistor MT. That is, if the bit line BL is discharged, it is determined that the threshold voltage of data stored in the memory cell transistor MT is lower than the read voltage $V_{select}$. Meanwhile, if the bit line BL is not discharged, it is determined that the threshold voltage of data stored in the memory cell transistor MT is higher than the read voltage $V_{select}$.

The read voltage $V_{select}$ is set for each read level described later. It will be described with reference to FIG. 4. Each read level is defined as a predetermined voltage range that allows to distinguish between data of which the threshold distributions are adjacent to each other among the data that can be stored in the memory cell transistor MT.

In the present embodiment, the memory cell transistor MT has four read levels: LM level, A level, B level and C level. The LM level (a first read level) is to distinguish between data "E" and data "LM" during a read operation when the upper page is not yet programmed. The A level (a second read level) is to distinguish between data "E", data "A", data "B", and data "C" during a read operation when the upper page is already programmed. The B level (a third read level) is to distinguish between data "E", data "A", data "B", and data "C" during a read operation when the upper page is already programmed. The C level (a fourth read level) is to distinguish between data "E", data "A", data "B", and data "C" during a read operation when the upper page is already programmed.

During a lower page read operation when the upper page is not yet programmed, by using the read voltage $V_{RLM}$ set for the LM level, it is possible to identify the lower page data stored in the memory cell transistor MT. During a lower page read operation when the upper page is already programmed, since data "1", "1", "0", and "0" are assigned to the lower pages, by using the read voltage $V_{RB}$ set for the B level, it is possible to identify the lower page data stored in the selected memory cell transistor MT.

During an upper page read operation, since data "1", "0", "0", and "1" are assigned to the upper pages, by using read voltages $V_{RA}$ and $V_{RC}$ set for the A level and the C level, it is possible to identify the upper page data stored in the selected memory cell transistor MT.

In the memory system according to the present embodiment, commonly for the word lines WL0 to WL31 within the block BLK, a first common read voltage $V_{RLM}$, a second common read voltage $V_{RA}$, a third common read voltage $V_{RB}$, and a fourth common read voltage $V_{RC}$ are set for the LM level, the A level, the B level, and the C level, respectively.

In addition to the first, second, third, and fourth common read voltages $V_{RLM}$, $V_{RA}$, $V_{RB}$, and $V_{RC}$, a corrected read voltage $V_{select}$ higher than the first, second, third, and fourth common read voltages $V_{RLM}$, $V_{RA}$, $V_{RB}$, and $V_{RC}$, is set for the word lines WL0 and WL31. This is provided considering an erroneous data programming generated in the word lines WL0 and WL31. Hereinafter, the erroneous data programming generated in the word lines WL0 and WL31 will be described.

Figure 5:
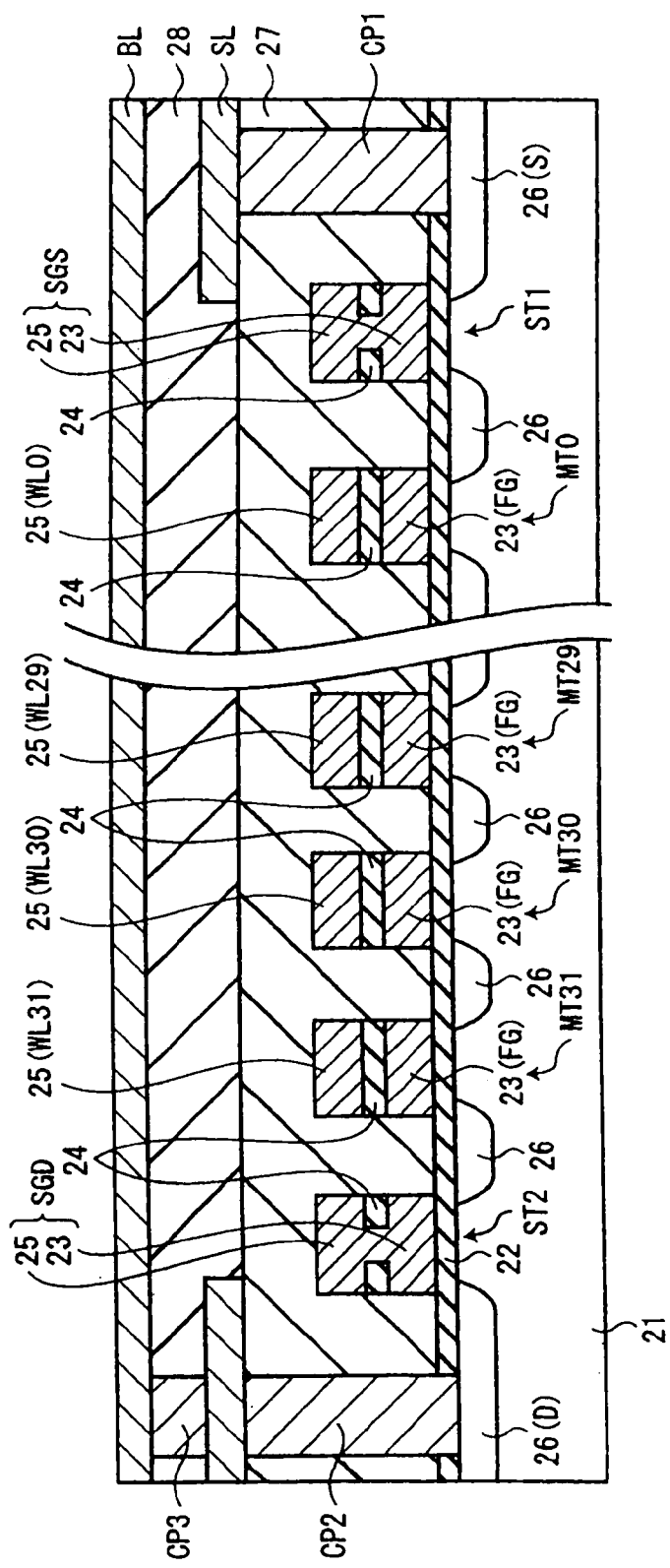
FIG. 5 is an exemplary sectional view taken along a bit line, showing the arrangement of a NAND cell unit of the nonvolatile semiconductor memory system according to the first embodiment of the invention.

First, the sectional arrangement of the NAND cell unit NU will be described before describing the erroneous data programming generated in the word lines WL0 and WL31. FIG. 5 is a sectional view taken along the bit line BL of the NAND cell unit NU. A gate insulating film 22 is formed on the P-type semiconductor substrate 21, and gate electrodes of the memory cell transistors MT0 to MT31 and the first and second select transistor ST1 and ST2 are formed on the gate insulating film 22. The gate electrodes of the memory cell transistor MT and the first and second select transistor ST1 and ST2 includes a polysilicon layer 23 formed on the gate insulating film 22, an inter-gate insulating film 24 formed on the polysilicon layer 23, and a polysilicon layer 25 formed on the inter-gate insulating film 24. The inter-gate insulating film 24 is formed, for example, of an ONO film (which is a stack structure of silicon oxide film, silicon nitride film, and silicon oxide film).

In the memory cell transistor MT, the polysilicon layer 23 serves as the floating gate electrode FG and accumulates electrons thereon. The polysilicon layer 25 is commonly connected to the memory cell transistors MT adjacent to each other along the bit line BL and serves as a control gate electrode. The control gate electrodes commonly connected to the memory cell transistors MT constitute the word lines WL.

In the first and second select transistors ST1 and ST2, the polysilicon layer 23 and the polysilicon layer 25 are electrically connected to each other via an opening provided in the gate insulating film 24 and serve as a control gate electrode. The polysilicon layer 25 is commonly connected to the first and second select transistors ST1 and ST2 adjacent to each other along the bit line. The control gate electrodes commonly connected to the first and second select transistors ST1 and ST2 constitute the first and second select gate lines SGS and SGD. On the surface of the P-type semiconductor substrate 21 disposed between the gate electrodes, an N-type impurity diffusion layer 26 is formed. The N-type impurity diffusion layer 26 is shared by adjacent transistors and serves as a source S and a drain D.

On the region of the P-type semiconductor substrate 21, a first interlayer insulating film 27 is formed to cover the memory cell transistor MT and the first and second select transistors ST1 and ST2. A contact plug CP1 is formed in the first interlayer insulating film 27 so as to reach the impurity diffusion layer 26 (source) of the first select transistor ST1 close to the source line SL. A metal wiring layer is formed on the first interlayer insulating film 27 so as to be connected to the contact plug CP1. This metal wiring layer serves as the source line SL.

A contact plug CP2 is formed in the first interlayer insulating film 27 so as to reach the impurity diffusion layer (drain) of the second select transistor ST2. A metal wiring layer is formed on the first interlayer insulating film 27 so as to be connected to the contact plug CP2. A second interlayer insulating film 28 is formed on the first interlayer insulating film 27 so as to cover the metal wiring layer. A contact plug CP3 is formed in the second interlayer insulating film 28 so as to reach the metal wiring layer. A metal wiring layer is formed on the second interlayer insulating film 28 so as to be commonly connected to a plurality of the contact plug CP3. This metal wiring layer serves as the bit line BL.

Figure 6:
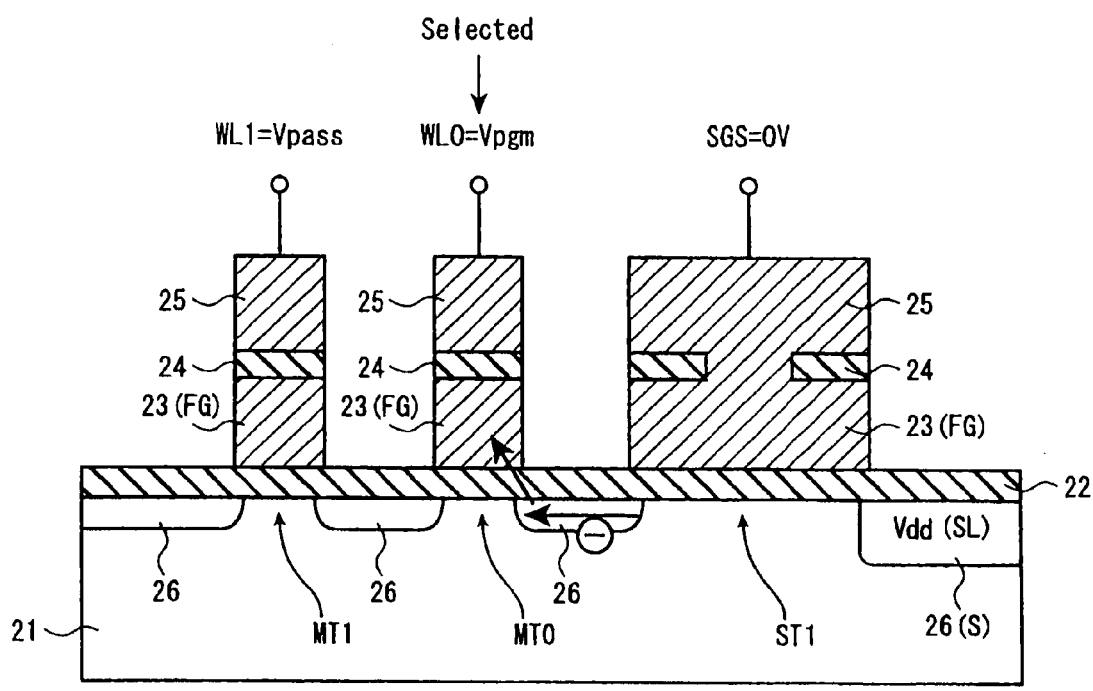
FIG. 6 is an exemplary conceptual diagram showing the principle of erroneous data programming in the nonvolatile semiconductor memory system according to the first embodiment of the invention.

In the memory cell array 10 having such an arrangement, there is a possibility of the erroneous data programming as described later. FIG. 6 is a schematic diagram showing the principle of the erroneous data programming in the memory cell transistor MT0 connected to the selected word line WL0, to which data is not to be programmed (for example, the memory cell transistor MT0 constituting the even page when data is programmed into the odd page of the word line WL0).

Since the NAND-type flash memory 2 utilizes the FN (Fowler-Nordheim) tunnel current during programming, it is necessary to apply a high program voltage $V_{pgm}$ of about 20 V to the selected word line WL0.

As described above, during program operations, since the first select gate line SGS is applied with 0 V, the source line SL and the memory cell transistor MT0 are cut off by the first select transistor ST1. At this time, the bit line BL connected to the NAND cell unit NU that includes the memory cell transistor MT0 to which data is not to be programmed is applied with $V_{dd}$, and the second select transistor ST2 is in the OFF state. Therefore, the memory cell group MG is in an electrically floating state. As a result, the channel potential of the memory cell transistor MT increases due to the coupling of the selected word line WL0 applied with the program voltage $V_{pgm}$ and the non-selected word line WL applied with the program pass voltage $V_{pass}$.

With this, in the NAND cell unit NU that includes the memory cell transistor MT0 to which data is not to be programmed, a high drain-source voltage is applied between the channels of the first select gate transistor ST1 and the memory cell transistor MT0 so electrons are accelerated and thus generating hot electrons. The accelerated electrons may collide with each other to generate hot electron-hole pairs.

These hot electrons are drawn into the floating gate electrode FG of the memory cell transistor MT0 applied with the program voltage $V_{pgm}$, to which data is not to be programmed, thus causing an erroneous data programming, i.e., causing electrons to be injected into the floating gate electrode FG. As a result, the threshold voltage of the memory cell transistor MT0 to which data is already programmed is shifted toward high voltage. Such an erroneous program current is called GIDL (Gate Induced Drain Leakage). Similarly, the erroneous data programming due to GIDL is caused in the memory cell transistor MT31 connected to the word line WL31.

Even when the word line WL0 is not selected, the word line WL0 is applied with the program pass voltage $V_{pass}$ lower than the program voltage $V_{pgm}$. Since the program pass voltage $V_{pass}$ is is applied to the non-selected word line WL whenever data is programmed in the block BLK, a small amount of electrons generated by GIDL can be injected into the floating gate electrode FG by the program pass voltage $V_{pass}$, thus causing the erroneous data programming. As a result, the threshold voltage of the memory cell transistor MT0 to which data is already programmed is shifted toward high voltage. Such an erroneous data programming becomes prominent with the decrease in the size of the memory cell and with the subdivision of the threshold voltage.

In the memory system according to the present embodiment, considering the effect of the erroneous data programming due to GIDL, the read voltage $V_{select}$ applied to the word lines WL0 and WL31 is corrected. Hereinafter, correction of the read voltage $V_{select}$ applied to the word line WL0 will be described in detail.

For the read voltage $V_{select}$ applied to the word line WL0, one or more corrected read voltages are set for each read level. Specifically, a first corrected read voltage $V_{RLM+}$ higher than the first common read voltage $V_{RLM}$ is set for the LM level, in addition to the first common read voltage $V_{RLM}$. A second corrected read voltage $V_{RA+}$ higher than the second common read voltage $V_{RA}$, a third corrected read voltage $V_{RA++}$ higher than the second corrected read voltage $V_{RA+}$, and a fourth corrected read voltage $V_{RA+++}$ higher than the third corrected read voltage $V_{RA++}$ are set for the A level, in addition to the second common read voltage $V_{RA}$. A fifth corrected read voltage $V_{RE+}$ higher than the third common read voltage $V_{RB}$, a sixth corrected read voltage $V_{RE++}$ higher than the fifth corrected read voltage $V_{RE+}$, and a seventh corrected read voltage $V_{RE+++}$ higher than the sixth corrected read voltage $V_{RE++}$ are set for the B level, in addition to the third common read voltage $V_{RE}$. An eighth corrected read voltage $V_{RC+}$ higher than the fourth common read voltage $V_{RC}$, a ninth corrected read voltage $V_{RC++}$ higher than the eighth corrected read voltage $V_{RC+}$, and a tenth corrected read voltage $V_{RC+++}$ higher than the ninth corrected read voltage $V_{RC++}$ are set for the C level, in addition to the fourth common read voltage $V_{RC}$.

As described above, the FeRAM 6 in the memory controller 1 stores the last read page of each block BLK (the page of which the page number is the largest among pages in the blocks BLK, to which data is already programmed). Referring to the last program page, when the programming is completed for the corrected pages shown in FIG. 7, a data read operation is performed using the corrected read voltage $V_{select}$, which in each read level, is higher than the first, second, third, and fourth common read voltages $V_{RLM}$, $V_{RA}$, $V_{RB}$, and $V_{RC}$.

Figure 8:
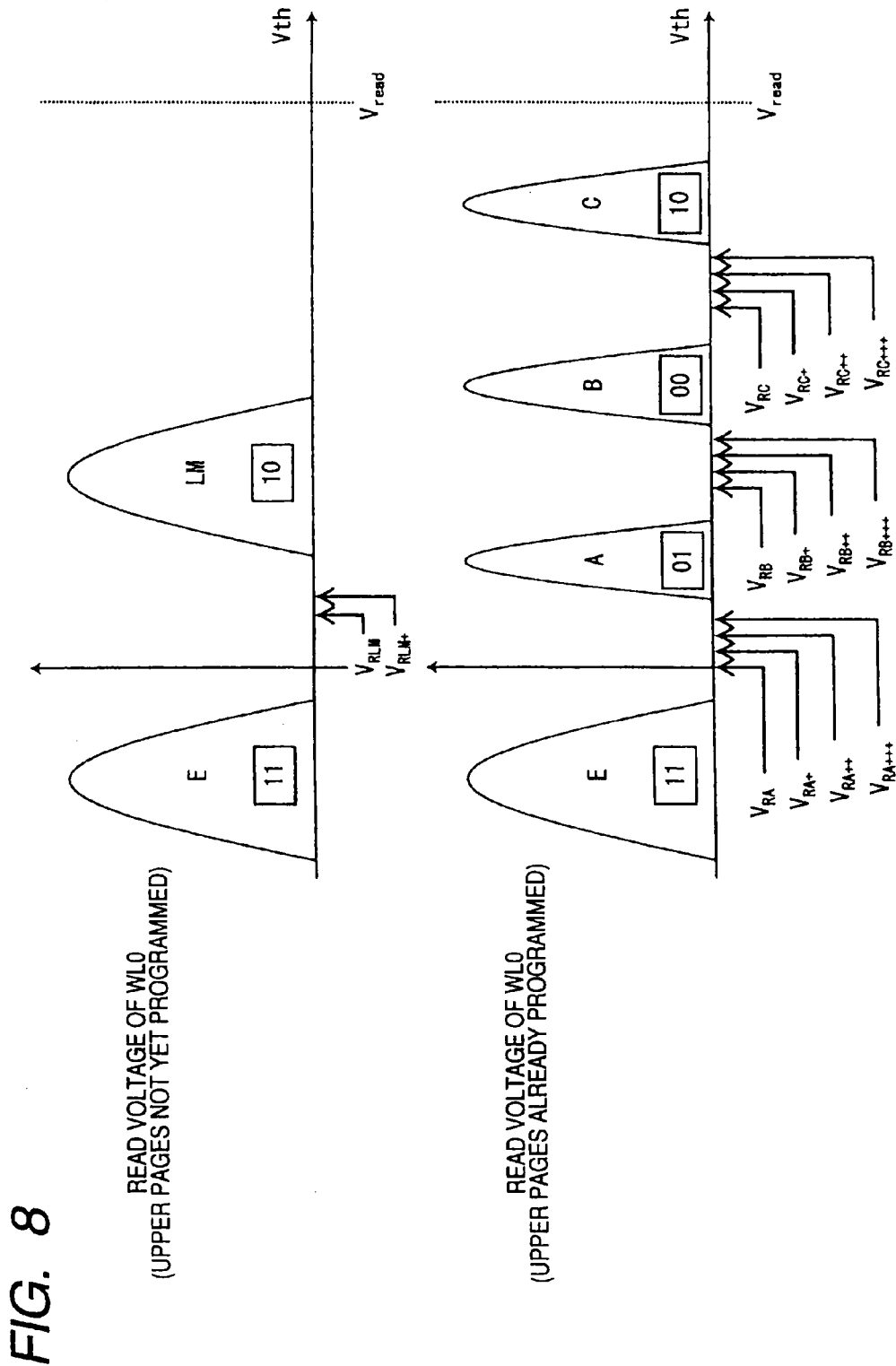
FIG. 8 is an exemplary schematic diagram showing the read voltage in the nonvolatile semiconductor memory system according to the first embodiment of the invention.

FIG. 7 is a table showing the corrected page of the read voltage considering the effect of the erroneous data programming due to GIDL in the word line WL0. FIG. 8 is a schematic diagram showing the threshold distribution of data stored in the memory cell transistor MT0 connected to the word line WL0 and the read voltage $V_{select}$ set for each read level.

Hereinafter, the relationship between the corrected page and the read voltage $V_{select}$ will be described with reference to FIGS. 7 and 8.

During read operations of the even lower page of word line WL0, the odd lower page of word line WL0, the odd upper page of word line WL0, the odd upper page of word line WL15 (a third word line), and the odd upper page of word line WL24 (a fourth word line) are used as the corrected page. That is, during read operations of the even lower page of word line WL0, when the programming is performed up to the odd lower page of word line WL0, the first corrected read voltage $V_{RLM+}$ set for the LM level is used considering that the threshold distribution of data stored in the even lower page of word line WL0 is shifted toward higher voltages by the effect of GIDL.

When the programming is performed up to the odd upper page of word line WL0, the fifth corrected read voltage $V_{RB+}$ set for the B level is used considering that the threshold distribution of data stored in the even lower page of word line WL0 is shifted toward higher voltages by the effect of GIDL. When the programming is performed up to the odd upper page of word line WL15, the sixth corrected read voltage $V_{RB++}$ set for the B level is used considering that the threshold distribution of data stored in the even lower page of word line WL0 is shifted toward higher voltages by the effect of GIDL. When the programming is performed up to the odd upper page of word line WL24, the seventh corrected read voltage $V_{RB+++}$ set for the B level is used considering that the threshold distribution of data stored in the even lower page of word line WL0 is shifted toward higher voltages by the effect of GIDL.

During read operations of the odd lower page of word line WL0, the even upper page of word line WL0, the odd upper page of word line WL15, and the odd upper page of word line WL24 are used as the corrected page. That is, during read operations of the odd lower page of word line WL0, when the programming is performed up to the even upper page of word line WL0, the first corrected read voltage $V_{RLM+}$ set for the LM level is used considering that the threshold distribution of data stored in the odd lower page of word line WL0 is shifted toward higher voltages by the effect of GIDL.

When the programming is performed up to the odd upper page of word line WL15, the fifth corrected read voltage $V_{RB+}$ set for the B level is used considering that the threshold distribution of data stored in the odd lower page of word line WL0 is shifted toward higher voltages by the effect of GIDL. When the programming is performed up to the odd upper page of word line WL24, the sixth corrected read voltage $V_{RB++}$ set for the B level is used considering that the threshold distribution of data stored in the odd lower page of word line WL0 is shifted toward higher voltages by the effect of GIDL.

During read operations of the even upper page of word line WL0, the odd upper page of word line WL0, the odd upper page of word line WL15, and the odd upper page of word line WL24 are used as the corrected page. That is, during read operations of the even upper page of word line WL0, when the programming is performed up to the odd upper page of word line WL0, the second corrected read voltage $V_{RA+}$ set for the A level and the eighth corrected read voltage $V_{RC+}$ set for the C level are used considering that the threshold distribution of data stored in the even upper page of word line WL0 is shifted toward higher voltages by the effect of GIDL.

When the programming is performed up to the odd upper page of word line WL15, the third corrected read voltage $V_{RA++}$ set for the A level and the ninth corrected read voltage $V_{RC++}$ set for the C level are used considering that the threshold distribution of data stored in the even upper page of word line WL0 is shifted toward higher voltages by the effect of GIDL. When the programming is performed up to the odd upper page of word line WL24, the fourth corrected read voltage $V_{RA+++}$ set for the A level and the tenth corrected read voltage $V_{RC+++}$ set for the C level are used considering that the threshold distribution of data stored in the even upper page of word line WL0 is shifted toward higher voltages by the effect of GIDL.

During read operations of the odd upper page of word line WL0, the odd upper page of word line WL15 and the odd upper page of word line WL24 are used as the corrected page. That is, during read operations of the odd upper page of word line WL0, when the programming is performed up to word line WL15, the second corrected read voltage $V_{RA+}$ set for the A level and the eighth corrected read voltage $V_{RC+}$ set for the C level are used considering that the threshold distribution of data stored in the odd upper page of word line WL0 is shifted toward higher voltages by the effect of GIDL.

When the programming is performed up to the odd upper page of word line WL24, the third corrected read voltage $V_{RA++}$ set for the A level and the ninth corrected read voltage $V_{RC++}$ set for the C level are used considering that the threshold distribution of data stored in the odd upper page of word line WL0 is shifted toward higher voltages by the effect of GIDL.

For word line WL31, the corrected read voltage $V_{select}$ is set in a manner similar to word line WL0.

For the read voltage $V_{select}$ applied to the word line WL31, one or more corrected read voltages are set for each read level. Specifically, an eleventh corrected read voltage $V_{RLM+}$ (WL31) higher than the first common read voltage $V_{RLM}$ is set for the LM level, in addition to the first common read voltage $V_{RLM}$. A twelfth corrected read voltage $V_{RA+}$ (WL31) higher than the second common read voltage $V_{RA}$ is set for A level, in addition to the second common read voltage $V_{RA}$. A thirteenth corrected read voltage $V_{RB+}$ (WL31) higher than the third common read voltage $V_{RB}$ is set for B level, in addition to the third common read voltage $V_{RB}$. A fourteenth corrected read voltage $V_{RC+}$ (WL31) higher than the fourth common read voltage $V_{RC}$ is set for C level, in addition to the fourth common read voltage $V_{RC}$.

During read operations of the even lower page of word line WL31, the odd lower page of word line WL31 and the odd upper page of word line WL31 are used as the corrected page. That is, during read operations of the even lower page of word line WL31, when the programming is performed up to the odd lower page of word line WL31, the eleventh corrected read voltage $V_{RLM+}$ (WL31) set for the LM level is used considering that the threshold distribution of data stored in the even lower page of word line WL31 is shifted toward higher voltages by the effect of GIDL.

When the programming is performed up to the odd upper page of word line WL31, the thirteenth corrected read voltage $V_{RB+}$ (WL31) set for the B level is used considering that the threshold distribution of data stored in the even lower page of word line WL31 is shifted toward higher voltages by the effect of GIDL.

During read operations of the odd lower page of word line WL31, the even upper page of word line WL31 is used as the corrected page. That is, during read operations of the odd lower page of word line WL31, when the programming is performed up to the even upper page of word line WL31, the eleventh corrected read voltage $V_{RLM+}$ (WL31) set for the LM level is used considering that the threshold distribution of data stored in the odd lower page of word line WL31 is shifted toward higher voltages by the effect of GIDL.

During read operations of the even upper page of word line WL31, the odd upper page of word line WL31 is used as the corrected page. That is, during read operations of the even upper page of word line WL31, when the programming is performed up to the odd upper page of word line WL31, the twelfth corrected read voltage $V_{RA+}$ (WL31) set for the A level and the fourteenth corrected read voltage $V_{RC+}$ (WL31) set for the C level are used considering that the threshold distribution of data stored in the even upper page of word line WL31 is shifted toward higher voltages by the effect of GIDL.

During read operations of the odd upper page of word line WL31, since the even upper page of word line WL31 is the page to which the programming is performed the last in the block BLK, it is not necessary to consider the shift of the threshold distribution by the effect of GIDL. Therefore, the second common read voltage $V_{RA}$ set for the A level and the fourth common read voltage $V_{RC}$ set for the C level are used.

The first to fourteenth corrected read voltages $V_{RLM+}$, $V_{RA+}$, $V_{RA++}$, $V_{RA+++}$, $V_{RB+}$, $V_{RB++}$, $V_{RB+++}$, $V_{RC+}$, $V_{RC++}$, $V_{RC+++}$, $V_{RLM+}$ (WL31), $V_{RA+}$ (WL31), $V_{RB+}$ (WL31), and $V_{RC+}$ (WL31) are set to predetermined values that are statistically determined by measuring the amount of shift of the threshold distribution of data stored in the memory cell transistor MT0 connected to word line WL0 or the memory cell transistor MT31 connected to word line WL31 by the effect of the erroneous data programming due to GIDL. These common read voltages are preferably set so as to maintain predetermined voltage difference between the first, second, third, and fourth common read voltages $V_{RLM}$, $V_{RA}$, $V_{RB}$, and $V_{RC}$ in each read level and the threshold voltage lower limits $V_{VLM}$, $V_{VA}$, $V_{VB}$, and $V_{VC}$ of each data.

Assuming the amount of shift of the threshold voltage due to GIDL in the word lines WL0 and WL31 be the same, the first corrected read voltage $V_{RLM+}$, the second corrected read voltage $V_{RA+}$, the fifth corrected read voltage $V_{RB+}$, and the eighth corrected read voltage $V_{RC+}$ may be set to the same values as the eleventh corrected read voltage $V_{RLM+}$ (WL31), the twelfth corrected read voltage $V_{RA+}$ (WL31), the thirteenth corrected read voltage $V_{RB+}$ (WL31), and the fourteenth corrected read voltage $V_{RC+}$ (WL31), respectively.

The first to fourteenth corrected read voltages $V_{RLM+}$, $V_{RA+}$, $V_{RA++}$, $V_{RA+++}$, $V_{RB+}$, $V_{RB++}$, $V_{RB+++}$, $V_{RC+}$, $V_{RC++}$, $V_{RC+++}$, $V_{RLM+}$ (WL31), $V_{RA+}$ (WL31), $V_{RB+}$ (WL31), and $V_{RC+}$ (WL31) may be set to values that are individually determined during a test step before shipping by measuring the amount of shift of the threshold voltage by the effect of the erroneous data programming due to GIDL. In this case, information about the first to fourteenth corrected read voltages $V_{RLM+}$, $V_{RA+}$, $V_{RA++}$, $V_{RA+++}$, $V_{RB+}$, $V_{RB++}$, $V_{RB+++}$, $V_{RC+}$, $V_{RC++}$, $V_{RC+++}$, $V_{RLM+}$ (WL31), $V_{RA+}$ (WL31), $V_{RB+}$ (WL31), and $V_{RC+}$ (WL31) may be stored in an initial setup information storage area of the memory cell array 10 so that the information is read out when the memory system is started.

Since four pages are assigned to each of the 32 word lines WL in the block BLK, the last program page in each block BLK can be expressed by seven bits. Since the memory cell array 10 includes 2048 blocks BLK, the FeRAM 6 used to store the last program page requires a capacity of about 2 Kb.

Figure 9:
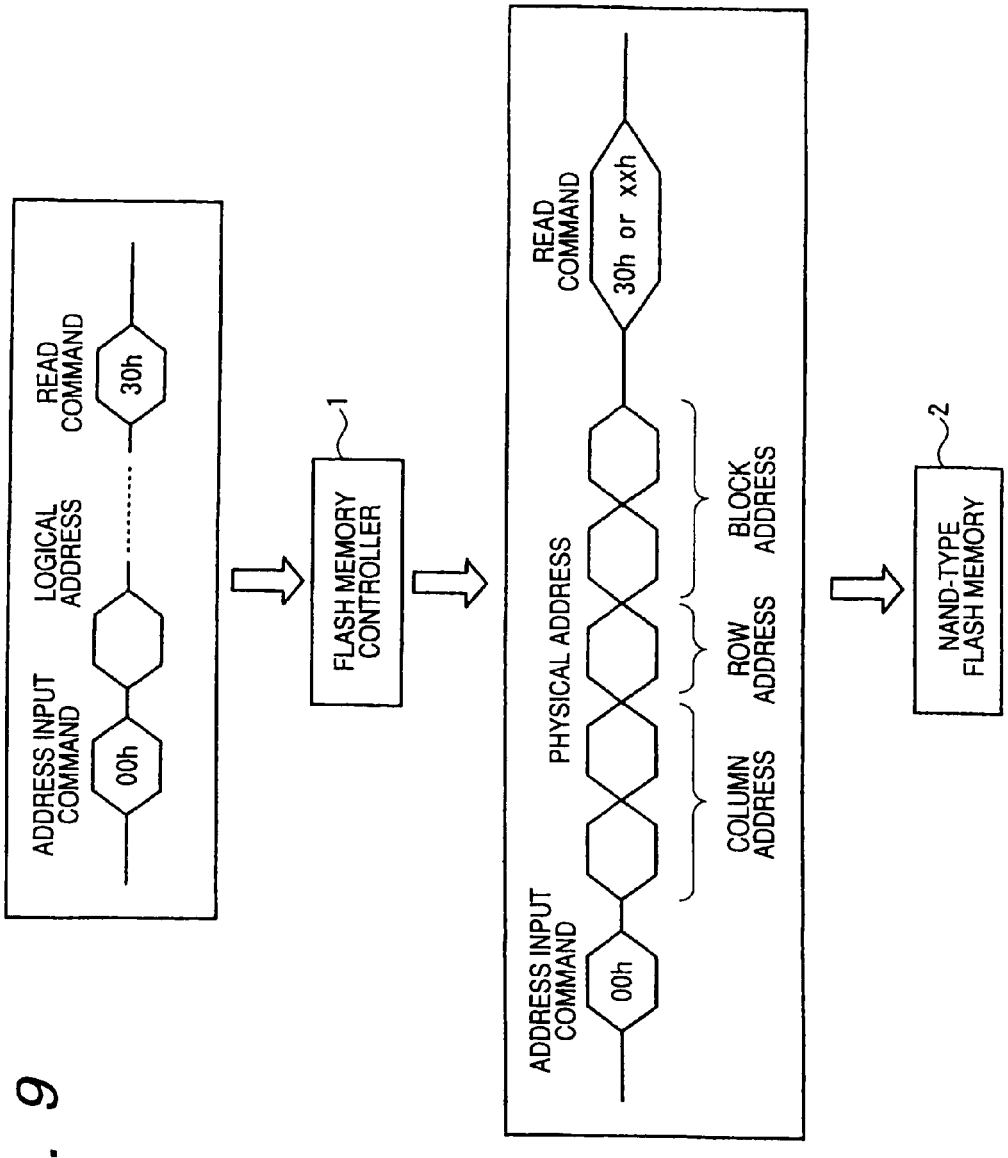
FIG. 9 is an exemplary schematic diagram showing the relationship between input commands and addresses and the nonvolatile semiconductor memory system according to the first embodiment of the invention.

Next, operations when a data read command is input to the memory system in which the above-described read voltage $V_{select}$ is set will be described with reference to FIG. 9. FIG. 9 shows the relationship between the commands and addresses input to the memory controller 1 and the commands and addresses input from the memory controller 1 to the NAND-type flash memory 2.

First, a series of commands and addresses, for example, "00h-logical_address-30h" are input to the memory controller 1 from a host device (not shown). Here, "00h" is an address input command, and "30h" is a read command. That is, when seen from the outside of the memory system, the access is made in the same manner as the conventional method.

Next, in the memory controller 1, by referring to a logical-physical conversion table stored in the FeRAM 6, the MCU 8 determines whether the designated logical address corresponds to the physical address of the page assigned to the word line WL0 or WL31. When the logical address corresponds to the physical address of the page assigned to the word line WL0 or WL31, the last program page in the block BLK that includes the word line WL0 or WL31 is read from the FeRAM 6 into the MCU 8. Then, a computational process is performed to determine whether it is necessary to correct the read voltage $V_{select}$, and if necessary, which read voltage $V_{select}$ is to be selected.

When the logical address input to the memory controller 1 does not correspond to the physical address of the page assigned to the word line WL0 or WL31, or when it is not necessary to correct the read voltage $V_{select}$ even though the logical address corresponds to the physical address of the page assigned to the word line WL0 or WL31, the series of commands and addresses, "00h-physical_address-30h", are input to the NAND-type flash memory 2 and are latched to the command register 13 and the address register 12 via the input/output control circuit 11.

The physical address includes a column address, a row address, and a block address. The column address latched to the address register 12 and the row address and block address are decoded by the column control circuit 17 and the row control circuit 16, respectively, and read operations are started using the first, second, third, and fourth common read voltages $V_{RLM}$, $V_{RA}$, $V_{RB}$, and $V_{RC}$ under the control of the main control circuit 14.

When as a result of the computational process in the MCU 8, it is determined that it is necessary to correct the read voltage $V_{select}$, the read voltage $V_{select}$ is selected from the first to fourteenth corrected read voltages $V_{RLM+}$, $V_{RA+}$, $V_{RA++}$, $V_{RA+++}$, $V_{RB+}$, $V_{RB++}$, $V_{RB+++}$, $V_{RC+}$, $V_{RC++}$, $V_{RC+++}$, $V_{RLM+}$ (WL31), $V_{RA+}$ (WL31), $V_{RB+}$ (WL31), and $V_{RC+}$ (WL31), which are set for each read level considering the effect of GIDL. Then, the read command "30h" is changed to "xxh" in accordance with the selected read voltage $V_{select}$, wherein xxh is a read command for applying the word line WL0 or WL31 with the first to fourteenth corrected read voltages $V_{RLM+}$, $V_{RA+}$, $V_{RA++}$, $V_{RA+++}$, $V_{RB+}$, $V_{RB++}$, $V_{RB+++}$, $V_{RC+}$, $V_{RC++}$, $V_{RC+++}$, $V_{RLM+}$ (WL31), $V_{RA+}$ (WL31), $V_{RB+}$ (WL31), and $V_{RC+}$ (WL31), which are set for each read level considering the effect of GIDL.

After the read command is changed, the series of commands and addresses, "00h-physical_address-xxh", are input to the NAND-type flash memory 2 and are latched to the address register 12 and the command register 13 via the input/output control circuit 11. The column address latched to the address register 12 and the row address and block address are decoded by the column control circuit 17 and the row control circuit 16, respectively, and read operations are started using the first to fourteenth corrected read voltages $V_{RLM+}$, $V_{RA+}$, $V_{RA++}$, $V_{RA+++}$, $V_{RB+}$, $V_{RB++}$, $V_{RB+++}$, $V_{RC+}$, $V_{RC++}$, $V_{RC+++}$, $V_{RLM+}$ (WL31), $V_{RA+}$ (WL31), $V_{RB+}$ (WL31), and $V_{RC+}$ (WL31) under the control of the main control circuit 14.

Hereinafter, it will be described in detail about the computational process of the MCU 8 determining whether it is necessary to correct the read voltage $V_{select}$ when the logical address corresponds to the physical address of the page assigned to word line WL0 and selecting the read voltage $V_{select}$ from the first to tenth corrected read voltages $V_{RLM+}$, $V_{RA+}$, $V_{RA++}$, $V_{RA+++}$, $V_{RB+}$, $V_{RB++}$, $V_{RB+++}$, $V_{RC+}$, $V_{RC++}$, and $V_{RC+++}$, which are set for each read level considering the effect of GIDL.

Figure 10:
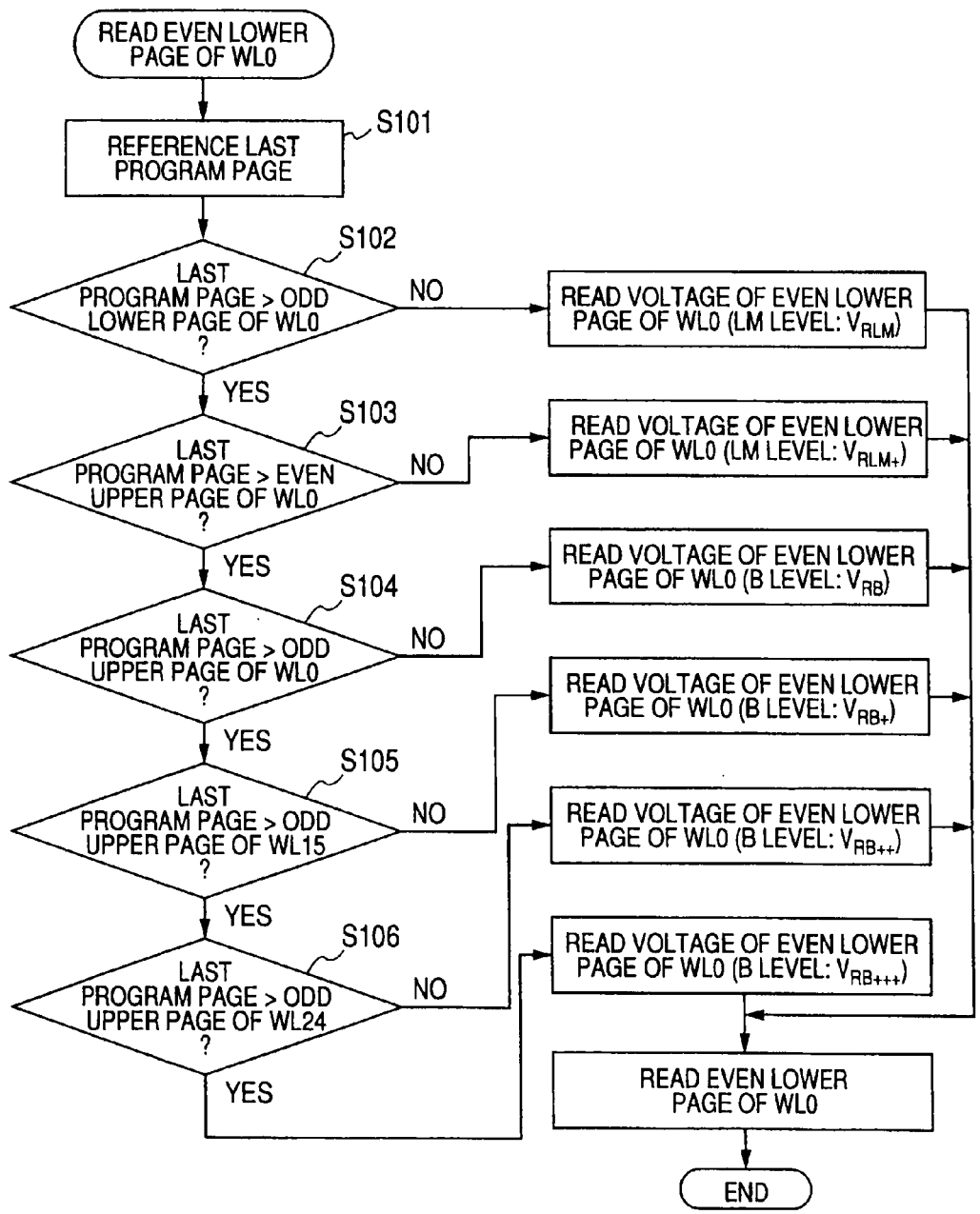
FIG. 10 is an exemplary flow chart showing a computational process performed by an MCU in the nonvolatile semiconductor memory system according to the first embodiment of the invention.

First, the read operation of the even lower page of word line WL0 will be described with reference to FIG. 10. FIG. 10 is a flow chart showing the computational process of the MCU 8 during the read operation of the even lower page of word line WL0.

First, the last program page stored in the FeRAM 6 is referenced (S101). Thereafter, the last program page is compared with the corrected page shown in FIG. 7, and the read voltage $V_{select}$ is selected.

Specifically, the last program page is compared with the odd lower page of word line WL0 (S102). If the last program page is not greater than the odd lower page of word line WL0, that is, if the programming is not performed to the page subsequent to the odd lower page of word line WL0, the first common read voltage $V_{RLM}$ set for the LM level is selected.

Meanwhile, if the last program page is greater than the odd lower page of word line WL0, that is, if the programming is performed to the page subsequent to the odd lower page of word line WL0, the last program page is compared with the even upper page of word line WL0 (S103). If the last program page is not greater than the even upper page of word line WL0, that is, if the programming is not performed to the page subsequent to the even upper page of word line WL0, the first corrected read voltage $V_{RLM+}$ set for the LM level is selected.

Meanwhile, if the last program page is greater than the even upper page of word line WL0, that is, if the programming is performed to the page subsequent to the even upper page of word line WL0, the last program page is compared with the odd upper page of word line WL0 (S104). If the last program page is not greater than the odd upper page of word line WL0, that is, if the programming is not performed to the page subsequent to the odd upper page of word line WL0, the third common read voltage $V_{RB}$ set for the B level is selected.

Meanwhile, if the last program page is greater than the odd upper page of word line WL0, that is, if the programming is performed to the page subsequent to the odd upper page of word line WL0, the last program page is compared with the odd upper page of word line WL15 (S105). If the last program page is not greater than the odd upper page of word line WL15, that is, if the programming is not performed to the page subsequent to the odd upper page of word line WL15, the fifth corrected read voltage $V_{RB+}$ set for the B level is selected.

Meanwhile, if the last program page is greater than the odd upper page of word line WL15, that is, if the programming is performed to the page subsequent to the odd upper page of word line WL15, the last program page is compared with the odd upper page of word line WL24 (S106). If the last program page is not greater than the odd upper page of word line WL24, that is, if the programming is not performed to the page subsequent to the odd upper page of word line WL24, the sixth corrected read voltage $V_{RB++}$ set for the B level is selected.

Meanwhile, if the last program page is greater than the odd upper page of word line WL24, that is, if the programming is performed to the page subsequent to the odd upper page of word line WL24, the seventh corrected read voltage $V_{RB+++}$ set for the B level is selected.

Figure 11:
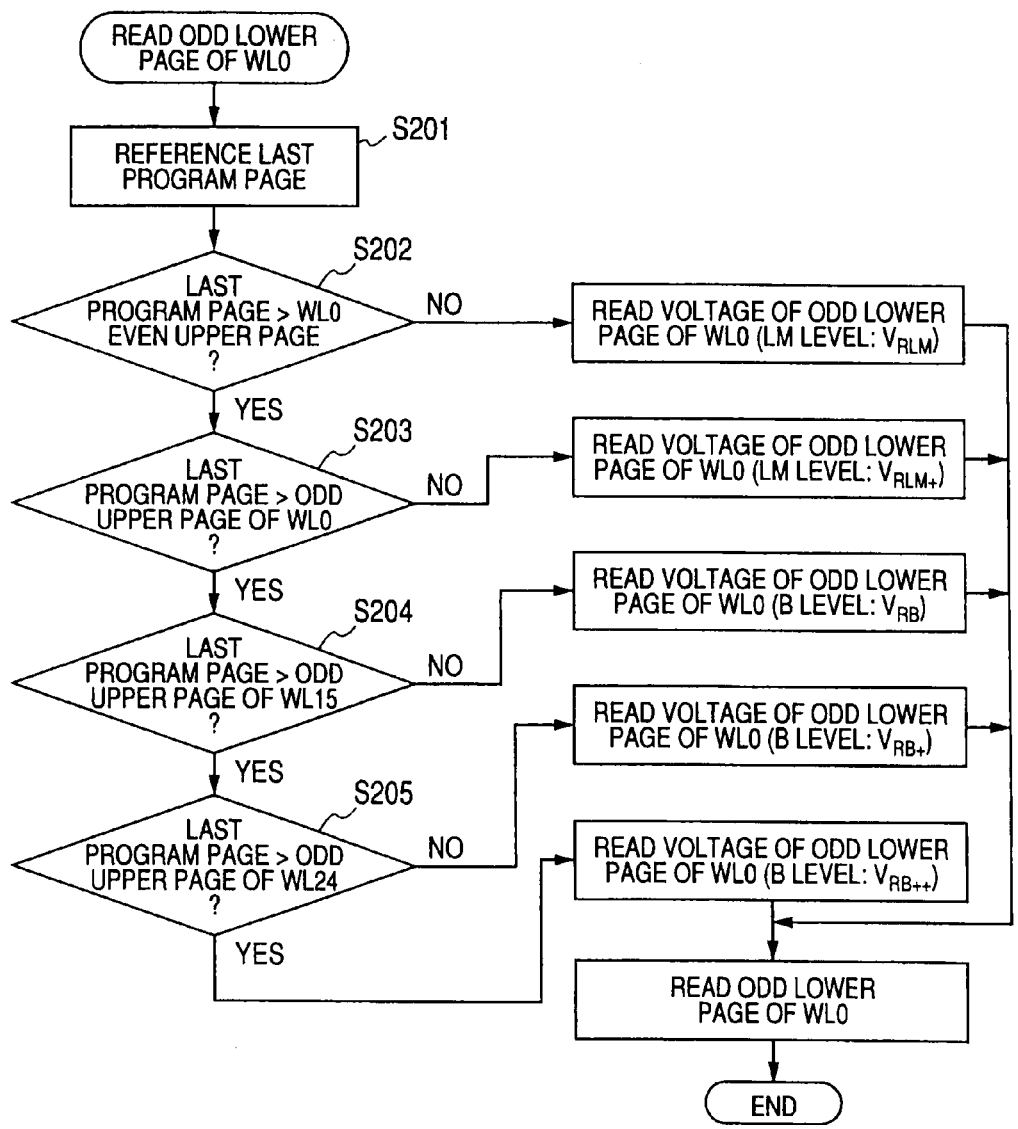
FIG. 11 is an exemplary flow chart showing a computational process performed by an MCU in the nonvolatile semiconductor memory system according to the first embodiment of the invention.

Next, the read operation of the odd lower page of word line WL0 will be described with reference to FIG. 11. FIG. 11 is a flow chart showing the computational process of the MCU 8 during the read operation of the odd lower page of word line WL0.

First, the last program page stored in the FeRAM 6 is referenced (S201). Thereafter, the last program page is compared with the corrected page shown in FIG. 7, and the read voltage $V_{select}$ is selected.

Specifically, the last program page is compared with the even upper page of word line WL0 (S202). If the last program page is not greater than the even upper page of word line WL0, that is, if the programming is not performed to the page subsequent to the even upper page of word line WL0, the first common read voltage $V_{RLM}$ set for the LM level is selected.

Meanwhile, if the last program page is greater than the even upper page of word line WL0, that is, if the programming is performed to the page subsequent to the even upper page of word line WL0, the last program page is compared with the odd upper page of word line WL0 (S203). If the last program page is not greater than the odd upper page of word line WL0, that is, if the programming is not performed to the page subsequent to the odd upper page of word line WL0, the first corrected read voltage $V_{RLM+}$ set for the LM level is selected.

Meanwhile, if the last program page is greater than the odd upper page of word line WL0, that is, if the programming is performed to the page subsequent to the odd upper page of word line WL0, the last program page is compared with the odd upper page of word line WL15 (S204). If the last program page is not greater than the odd upper page of word line WL15, that is, if the programming is not performed to the page subsequent to the odd upper page of word line WL15, the third common read voltage $V_{RB}$ set for the B level is selected.

Meanwhile, if the last program page is greater than the odd upper page of word line WL15, that is, if the programming is performed to the page subsequent to the odd upper page of word line WL15, the last program page is compared with the odd upper page of word line WL24 (S205). If the last program page is not greater than the odd upper page of word line WL24, that is, if the programming is not performed to the page subsequent to the odd upper page of word line WL24, the fifth corrected read voltage $V_{RB+}$ set for the B level is selected.

Meanwhile, if the last program page is greater than the odd upper page of word line WL24, that is, if the programming is performed to the page subsequent to the odd upper page of word line WL24, the sixth corrected read voltage $V_{RB++}$ set for the B level is selected.

Figure 12:
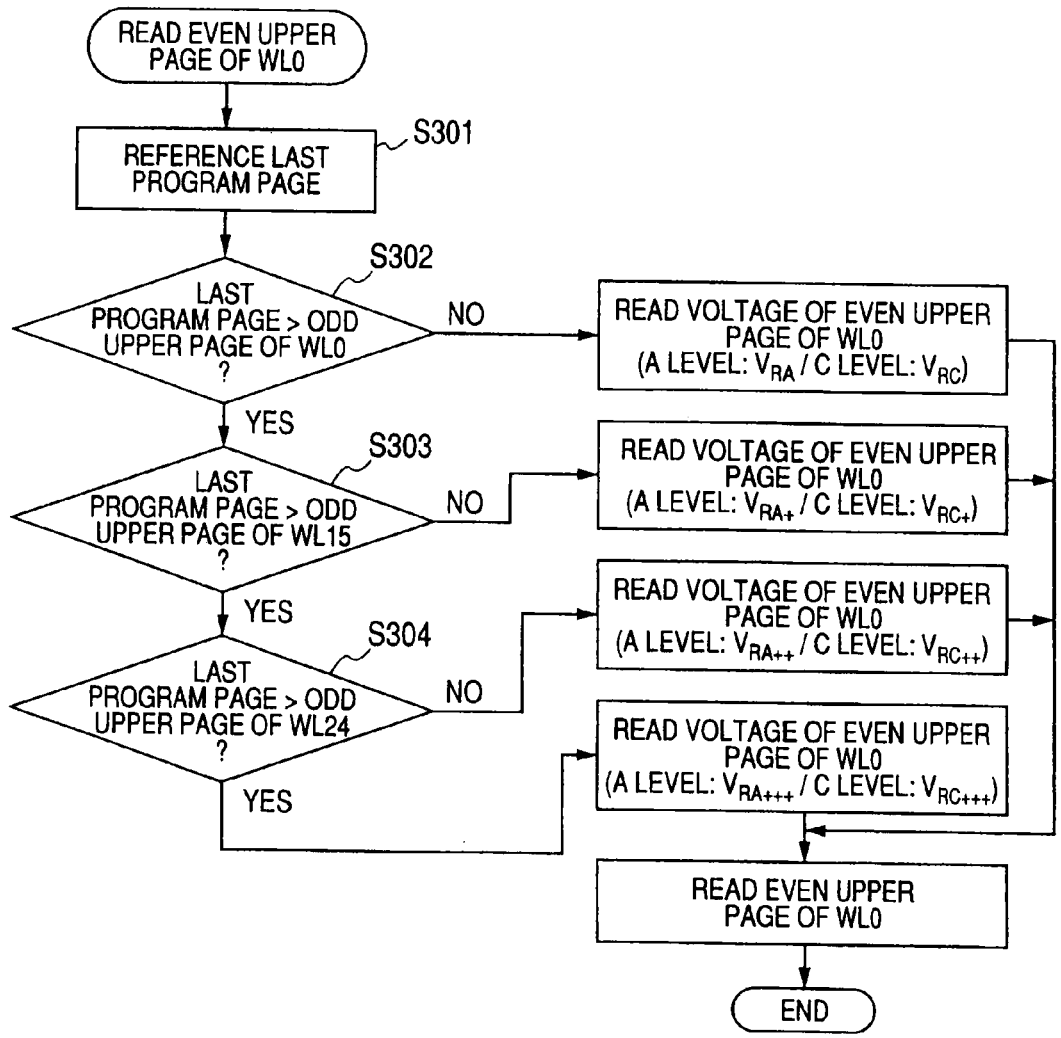
FIG. 12 is an exemplary flow chart showing a computational process performed by an MCU in the nonvolatile semiconductor memory system according to the first embodiment of the invention.

Next, the read operation of the even upper page of word line WL0 will be described with reference to FIG. 12. FIG. 12 is a flow chart showing the computational process of the MCU 8 during the read operation of the even upper page of word line WL0.

First, the last program page stored in the FeRAM 6 is referenced (S301). Thereafter, the last program page is compared with the corrected page shown in FIG. 7, and the read voltage $V_{select}$ is selected.

Specifically, the last program page is compared with the odd upper page of word line WL0 (S302). If the last program page is not greater than the odd upper page of word line WL0, that is, if the programming is not performed to the page subsequent to the odd upper page of word line WL0, the second common read voltage $V_{RA}$ set for the A level and the fourth common read voltage $V_{RC}$ set for the C level are selected.

Meanwhile, if the last program page is greater than the odd upper page of word line WL0, that is, if the programming is performed to the page subsequent to the odd upper page of word line WL0, the last program page is compared with the odd upper page of word line WL15 (S303). If the last program page is not greater than the odd upper page of word line WL15, that is, if the programming is not performed to the page subsequent to the odd upper page of word line WL15, the second corrected read voltage $V_{RA+}$ set for the A level and the eighth corrected read voltage $V_{RC+}$ set for the C level are selected.

Meanwhile, if the last program page is greater than the odd upper page of word line WL15, that is, if the programming is performed to the page subsequent to the odd upper page of word line WL15, the last program page is compared with the odd upper page of word line WL24 (S304). If the last program page is not greater than the odd upper page of word line WL24, that is, if the programming is not performed to the page subsequent to the odd upper page of word line WL24, the third corrected read voltage $V_{RA++}$ set for the A level and the ninth corrected read voltage $V_{RC++}$ set for the C level are selected.

Meanwhile, if the last program page is greater than the odd upper page of word line WL24, that is, if the programming is performed to the page subsequent to the odd upper page of word line WL24, the fourth corrected read voltage $V_{RA+++}$ set for the A level and the tenth corrected read voltage $V_{RC+++}$ set for the C level are selected.

Figure 13:
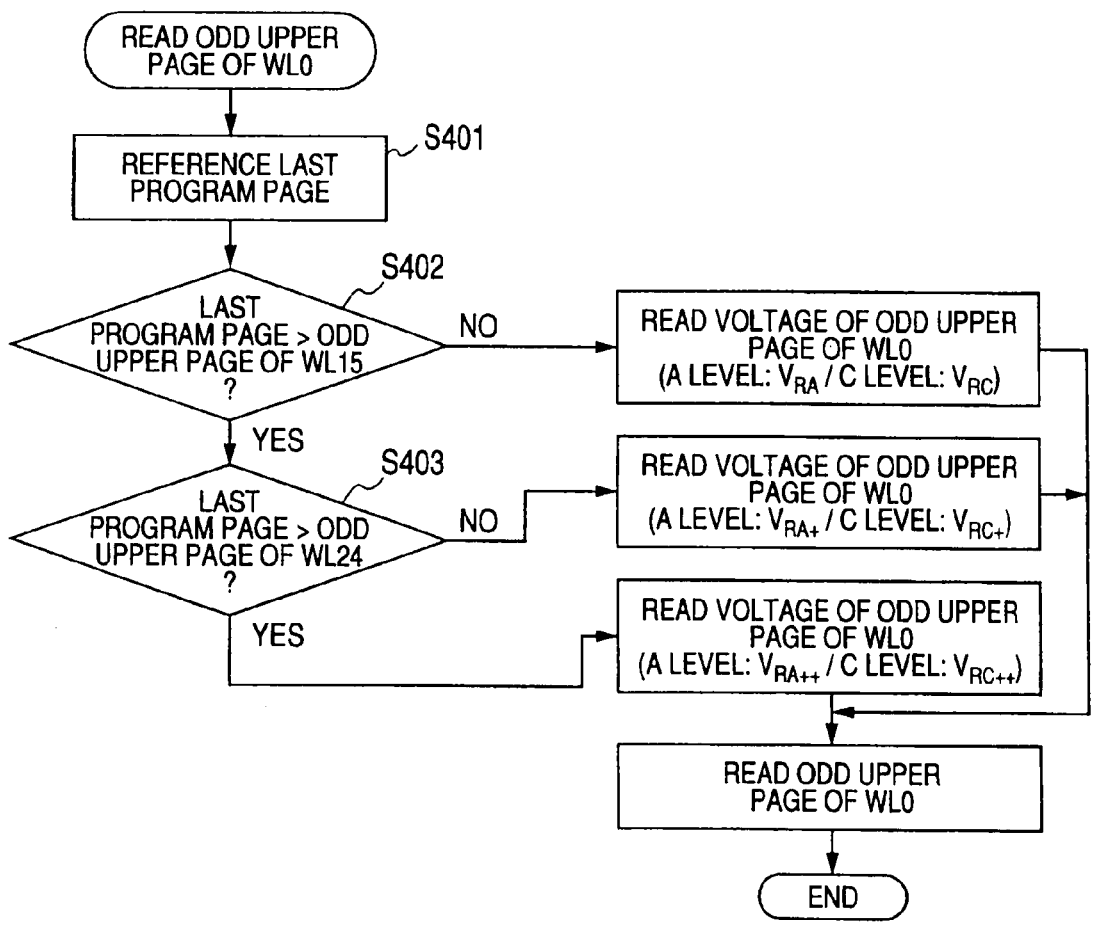
FIG. 13 is an exemplary flow chart showing a computational process performed by an MCU in the nonvolatile semiconductor memory system according to the first embodiment of the invention.

Next, the read operation of the odd upper page of word line WL0 will be described with reference to FIG. 13. FIG. 13 is a flow chart showing the computational process of the MCU 8 during the read operation of the odd upper page of word line WL0.

First, the last program page stored in the FeRAM 6 is referenced (S401). Thereafter, the last program page is compared with the corrected page shown in FIG. 7, and the read voltage $V_{select}$ is selected.

Specifically, the last program page is compared with the odd upper page of word line WL15 (S402). If the last program page is not greater than the odd upper page of word line WL15, that is, if the programming is not performed to the page subsequent to the odd upper page of word line WL15, the second common read voltage $V_{RA}$ set for the A level and the fourth common read voltage $V_{RC}$ set for the C level are selected.

Meanwhile, if the last program page is greater than the odd upper page of word line WL15, that is, if the programming is performed to the page subsequent to the odd upper page of word line WL15, the last program page is compared with the odd upper page of word line WL24 (S403). If the last program page is not greater than the odd upper page of word line WL24, that is, if the programming is not performed to the page subsequent to the odd upper page of word line WL24, the second corrected read voltage $V_{RA+}$ set for the A level and the eighth corrected read voltage $V_{RC+}$ set for the C level are selected.

Meanwhile, if the last program page is greater than the odd upper page of word line WL24, that is, if the programming is performed to the page subsequent to the odd upper page of word line WL24, the third corrected read voltage $V_{RA++}$ set for the A level and the ninth corrected read voltage $V_{R++}$ set for the C level are selected.

The computational process of the MCU 8 determining whether it is necessary to correct the read voltage $V_{select}$ when the logical address corresponds to the physical address of the page assigned to word line WL31 and selecting the read voltage $V_{select}$ from the eleventh to fourteenth corrected read voltages $V_{RLM+}$ (WL31), $V_{RA+}$ (WL31), $V_{RB+}$ (WL31), and $V_{RC+}$ (WL31), which are set for each read level considering the effect of GIDL is the same as that of word line WL0.

In the memory system according to the present embodiment, commonly for the word lines WL0 to WL31 within the block BLK, a first common read voltage $V_{RLM}$, a second common read voltage $V_{RA}$, a third common read voltage $V_{RB}$, and a fourth common read voltage $V_{RC}$ are set for the LM level, the A level, the B level, and the C level, respectively.

In addition to the first, second, third, and fourth common read voltages $V_{RLM}$, $V_{RA}$, $V_{RB}$, and $V_{RC}$, the first to fourteenth corrected read voltages $V_{RLM+}$, $V_{RA+}$, $V_{RA++}$, $V_{RA+++}$, $V_{RB+}$, $V_{RB++}$, $V_{RB+++}$, $V_{RC+}$, $V_{RC++}$, $V_{RC+++}$, $V_{RLM+}$ (WL31), $V_{RA+}$ (WL31), $V_{RB+}$ (WL31), and $V_{RC+}$ (WL31), which are higher than the first, second, third, and fourth common read voltages $V_{RLM}$, $V_{RA}$, $V_{RB}$, and $V_{RC}$, are set for the word lines WL0 and WL31.

With this, even when the threshold distribution is shifted toward higher voltages by the effect of the erroneous data programming due to GIDL in the memory cell transistors MT0 and MT31 connected to the word lines WL0 and WL31, it is possible to correct the read voltage $V_{select}$ in accordance with the amount of shift of the threshold distribution. Accordingly, it is possible to maintain a high degree of data reliability even with the subdivision of the threshold voltage and with the decrease in the size of the memory cell.

In the memory system according to the present embodiment, it has been described for the case in which each memory cell group MG of the NAND cell unit NU includes 32 memory cell transistors MT0 to MT31, and in which 32 word lines WL0 to WL31 are wired to commonly connect the gate electrodes of the memory cell transistors MT on the same row between adjacent NAND cell units NU. However, the invention is not limited to such a case but may have a arrangement in which each memory cell group MG of the NAND cell unit NU includes 64 memory cell transistors MT0 to MT63, and in which 64 word lines WL0 to WL63 are wired to commonly connect the gate electrodes of the memory cell transistors MT on the same row between adjacent NAND cell units NU.

In the memory system according to the present embodiment, it has been described for the case in which the memory cell array 10 includes 2048 blocks BLK. However, the invention is not limited to such a case but may have a arrangement in which the memory cell array 10 includes 4096 blocks BLK, for example.

In the memory system according to the present embodiment, the read voltage $V_{select}$ is set to have one correction step for the LM level of word line WL0 and three correction steps for the RA, RB, and RC levels of word line WL0. However, the read voltage $V_{select}$ may be set to have greater correction steps depending on the last program page stored in the FeRAM 6. For example, the read voltage $V_{select}$ may be corrected again for the odd upper page of word line WL7 and the odd upper page of word line WL28.

In the memory system according to the present embodiment, the read voltage $V_{select}$ is corrected when the programming is performed up to word line WL24 and the odd upper page of word line WL15. However, the invention is not limited to this and the corrected page may be appropriately set considering the effect of the erroneous data programming due to GIDL.

In the memory system according to the present embodiment, it has been described for the case of correcting the read voltage $V_{select}$ applied to the word lines WL0 and WL31. However, when the size of the memory cell transistor MT is further reduced, the threshold voltage can be varied by the effect of GIDL in word line WL1 adjacent to word line WL0 and in word line WL30 adjacent to word line WL31. Therefore, the read voltage $V_{select}$ applied to the word lines WL1 and WL30 may be corrected in a manner similar to the case of the word lines WL0 and WL31.

In the memory system according to the present embodiment, it has been described for the case in which the last program page is stored in the FeRAM 6 of the memory controller 1. However, the invention is not limited to the FeRAM but the last program page may be stored in other nonvolatile semiconductor memories such as MRAM (Magnetic Random Access Memory). The nonvolatile semiconductor memory used is preferably capable of operating at higher speed than the NAND-type flash memory 2 in order to maintain the operating speed of the memory system. Since the last program page is frequently updated, it is preferable that the upper limit of the number of rewritings is high.

Alternatively, without being limited to the nonvolatile semiconductor memory, the last program page may be stored in volatile semiconductor memories such as DRAM (Dynamic Random Access Memory) or SRAM (Static Random Access Memory). In this case, it is necessary to save the last program page in the NAND-type flash memory 2 since the stored last program page can be lost when the power supply is cut off.

In the memory system according to the present embodiment, it has been described for the case in which the data programming is sequentially performed in the order from word line WL0 to word line WL31. However, the invention is not limited to such a case. For example, the data program operation may be performed in the order of the even lower page of WLm (m: an integer from 0 to 30), the odd lower page of WLm, the even lower page of WLm+1, the even upper page of WLm, the odd upper page of WLm, the even upper page of WLm+1, and the odd upper page of WLm+1. In this case, the read voltage $V_{select}$ applied to the word lines WL0 and WL31 may be corrected considering the effect of the erroneous data programming due to GIDL.

In the memory system according to the present embodiment, each of the memory cell transistors MT can store one of 4-value data "xy" which is defined by upper page data "x" and lower page data "y" and in which in the order of a threshold voltage, data "E"="11", data "A"="01", data "B"="00", and data "C" (data "LM")="10" are assigned. However, the data assignment is not limited to this. For example, other data assignment methods may be used in which in the order of the threshold voltage, data "E"="11", data "A"="01", data "B" (data "LM")="10", and data "C"="00" are assigned. In this case, the read voltage $V_{select}$ applied to the word lines WL0 and WL31 may be corrected considering the effect of the erroneous data programming due to GIDL.

In the memory system according to the present embodiment, it has been described for the case in which intermediate data "LM" (data "10") is programmed during the lower page program operations. However, it is not necessary to enter the lower page program operation via the intermediate data programmed state. For example, the programming may be performed such that data "11", "10", "00", and "01" are assigned in the order of the threshold voltage, that programming of data from "11" to "00" is made during the lower page program operations, and that programming of data from "10" to "00" or from "11" to "01" is made during the upper page program operations. In this case, the read voltage $V_{select}$ applied to the word lines WL0 and WL31 may be corrected considering the effect of the erroneous data programming due to GIDL.

Figure 14:
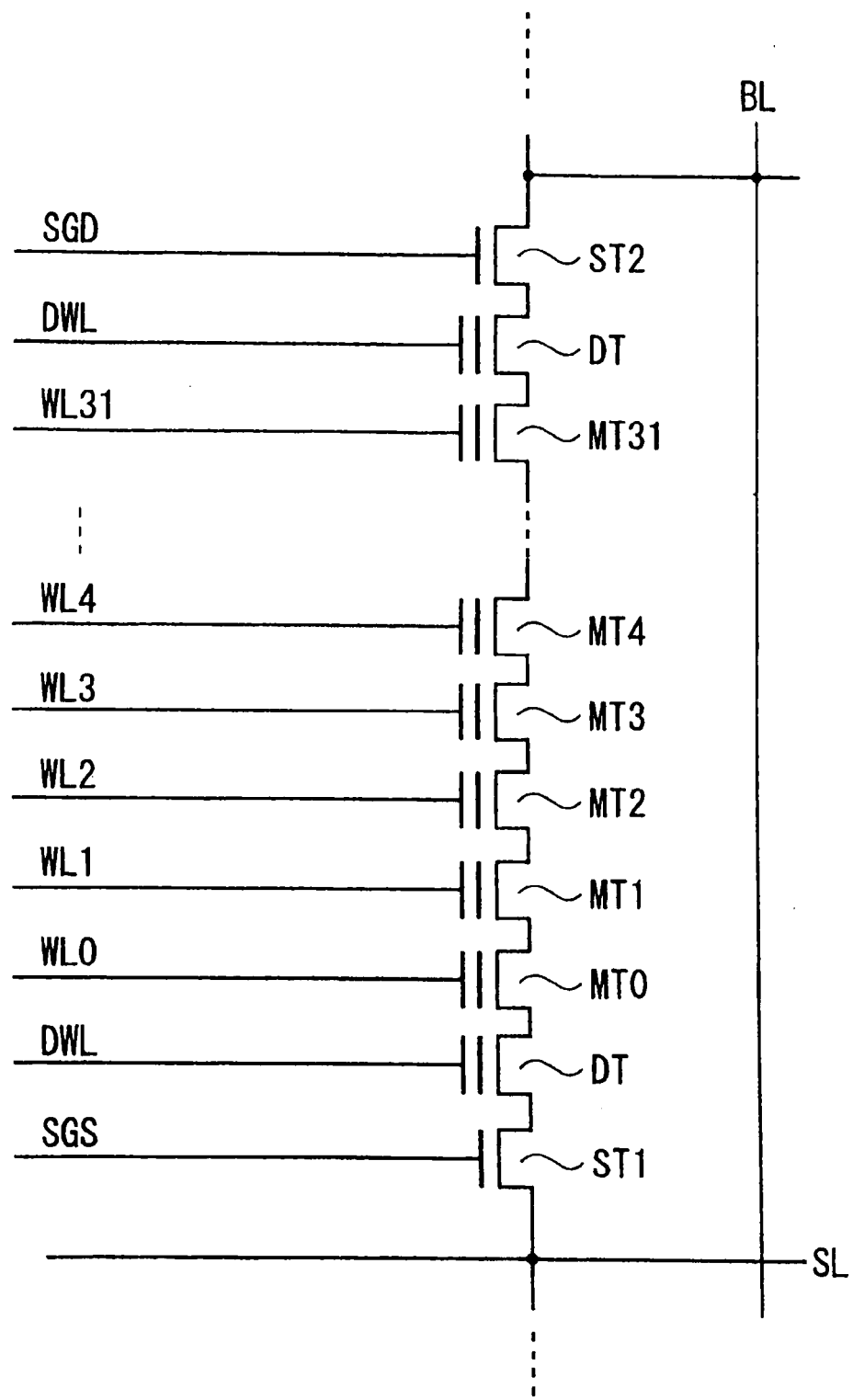
FIG. 14 is an exemplary circuit diagram showing an equivalent circuit of a modified example of the NAND cell unit in the nonvolatile semiconductor memory system according to the first embodiment of the invention.

In the memory system according to the present embodiment, it has been described for the case in which the word lines WL0 and WL31 for which the read voltage $V_{select}$ is corrected are disposed adjacent to the select gate lines SGS and SGD. However, as shown in FIG. 14, dummy cell transistors DT may be provided between the select transistor ST1 and the memory cell transistor MT0 and between the select transistor ST2 and the memory cell transistor MT31. FIG. 14 is a circuit diagram showing an equivalent circuit of a modified example of the NAND cell unit NU in the memory system according to the present embodiment. The current path of the dummy cell transistors DT is serially connected between the current path of the memory cell transistor MT and the current path of the select transistors ST1 and ST2, and the gate electrodes of the dummy cell transistors DT are commonly connected by a dummy word line DWL.

In the memory cell array having such a dummy word line DWL, there is a fear of the erroneous data programming due to GIDL when the size of the memory cell transistor MT is further reduced. In this case, the read voltage $V_{select}$ applied to the word lines WL0 and WL31 may be corrected considering the effect of the erroneous data programming due to GIDL.

In the memory system according to the present embodiment, it has been described for the case in which electrons are injected into the floating gate electrode FG and in which data is stored using the fact that the threshold voltage of the memory cell transistor MT varies in accordance with the amount of injected electrons. However, the invention is not limited to this but may be applied to the case in which charges are trapped in a charge storage layer such as silicon nitride film and in which data is stored using the fact that the threshold voltage of the memory cell transistor MT varies in accordance with the amount of trapped charges. In the case of using the silicon nitride film as the charge storage layer, the read voltage $V_{select}$ applied to the word lines WL0 and WL31 may be corrected considering the effect of the erroneous data programming due to GIDL.

In the memory system according to the present embodiment, it has been described for the case in which the sense amplifier SA is selectively connected via the selector circuit 19 to one of the even bit line BLe and the odd bit line BLo. However, the invention is not limited to this but may be constructed such that one sense amplifier SA corresponds to one bit line BL.

In this case, in a manner similar to the case of the present embodiment, a page arrangement may be employed in which the even bit line BLe and the odd bit line BL0 alternate with each other, and in which a set of the memory cell transistors MT selected by one word line WL and the even bit line BLe constitutes the even pages, and a set of the memory cell transistors MT selected by the one word line WL and the odd bit line BLo constitutes the odd pages. Alternatively, a page arrangement as shown in FIG. 15 may be employed.

Figure 15:
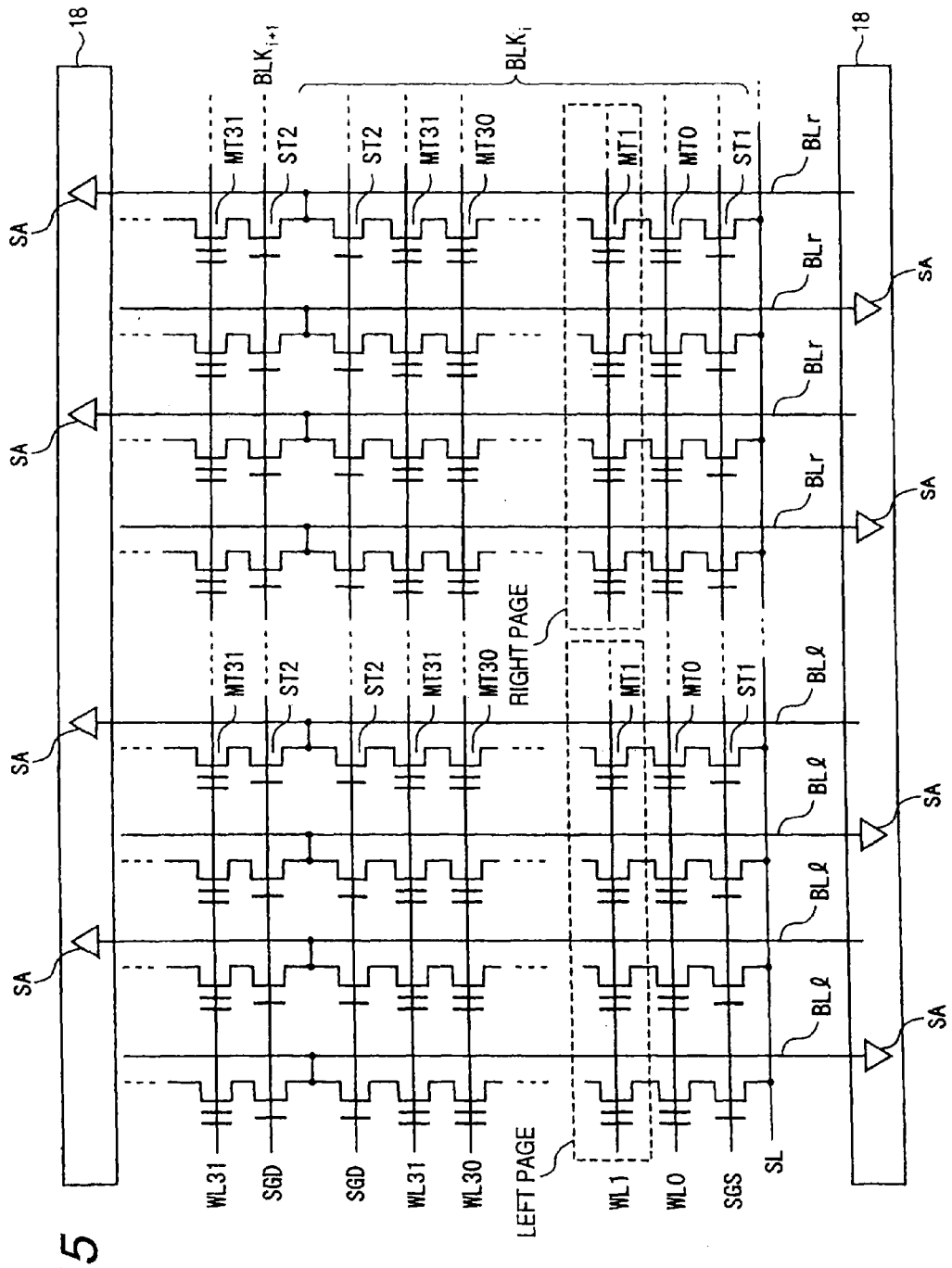
FIG. 15 is an exemplary circuit diagram showing an equivalent circuit of a modified example of the memory cell array in the nonvolatile semiconductor memory system according to the first embodiment of the invention.

FIG. 15 is a circuit diagram showing one equivalent circuit of a modified example of the memory cell array 10 in the memory system according to the present embodiment. As shown in FIG. 15, one sense amplifier SA is provided for one bit line BL, a set of the memory cell transistors MT selected by one word line WL within the block BLK and a group of bit lines BL1 that are successive from the left end among the bit lines BL within the block BLK constitutes one page (left page), and a set of the memory cell transistors MT selected by the one word line WL and the other group of bit lines BLr that are successive from the right end among the bit lines BL within the block BLK constitutes another one page (right page).

The programming of data within the block BLK is sequentially performed from word line WL0, which is the word line WL closest to the source line SL within the block, to word line WL31, and for one word line WL, in the order of the lower page of the left page, the lower page of the right page, the upper page of the right page, and the upper page of the right page. Therefore, four pages are assigned to one word line WL. In this case, since the threshold distribution of data stored in the memory cell transistor MT to which data is already programmed for the word lines WL0 and WL31 is shifted toward higher voltages by the effect of the erroneous data programming due to GIDL, the read voltage $V_{select}$ applied to the word lines WL0 and WL31 may be corrected considering the effect of the erroneous data programming due to GIDL.

Figure 27:
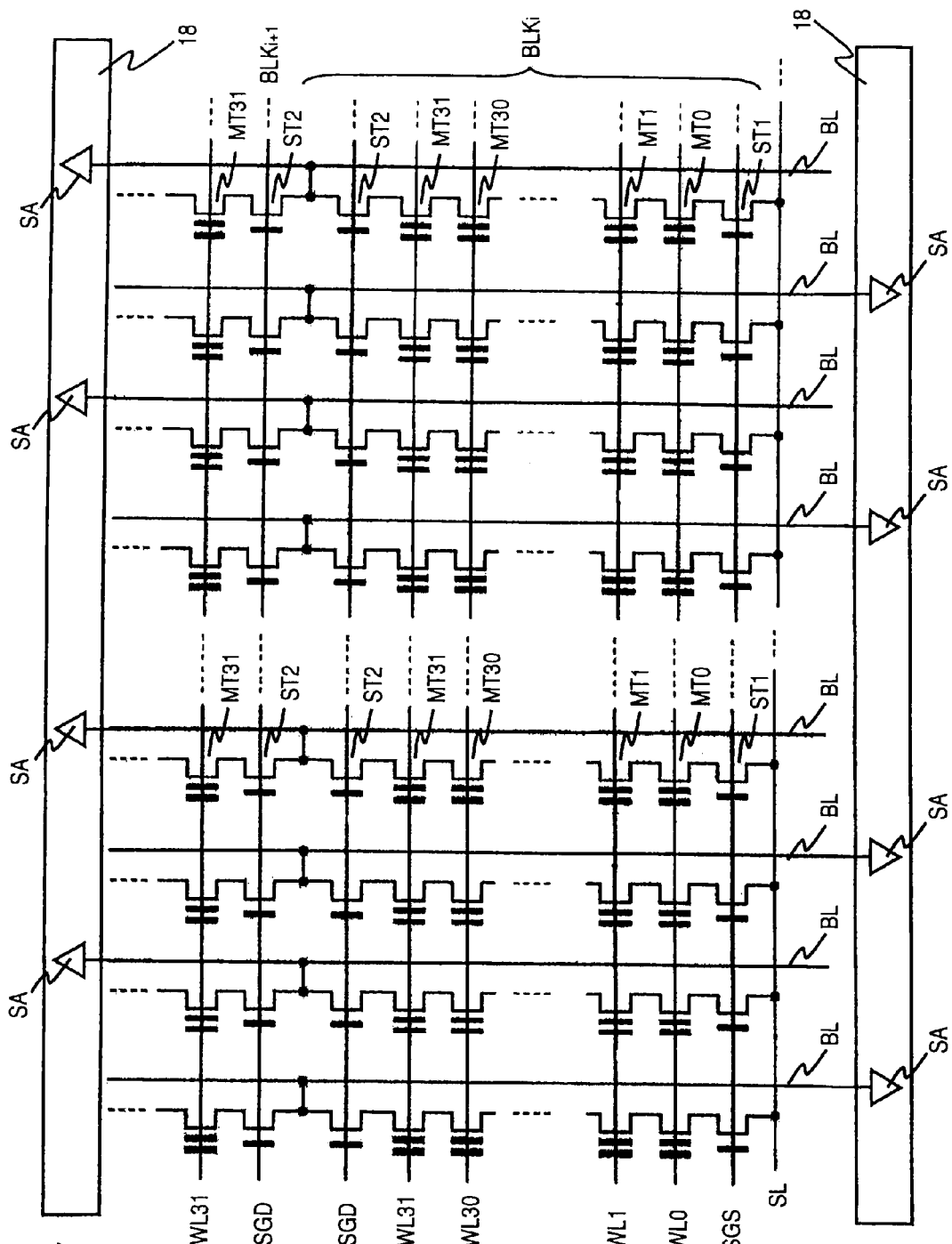
FIG. 27 is an exemplary circuit diagram showing an equivalent circuit of a modified example of the memory cell allay in the nonvolatile semiconductor memory system according to the first embodiment of the invention.

FIG. 27 is a circuit diagram showing the other equivalent circuit of a modified example of the memory cell array 10 in the memory system according to the present embodiment. As shown in FIG. 27, the bit lines are not separated into the odd bit line and the even bit line, or left page and right page. In this structure, GIDL caused by $V_{pgm}$ is ignorable. Therefore, the correction of $V_{select}$ should be considered only the effect of $V_{pass}$.

Figure 28:
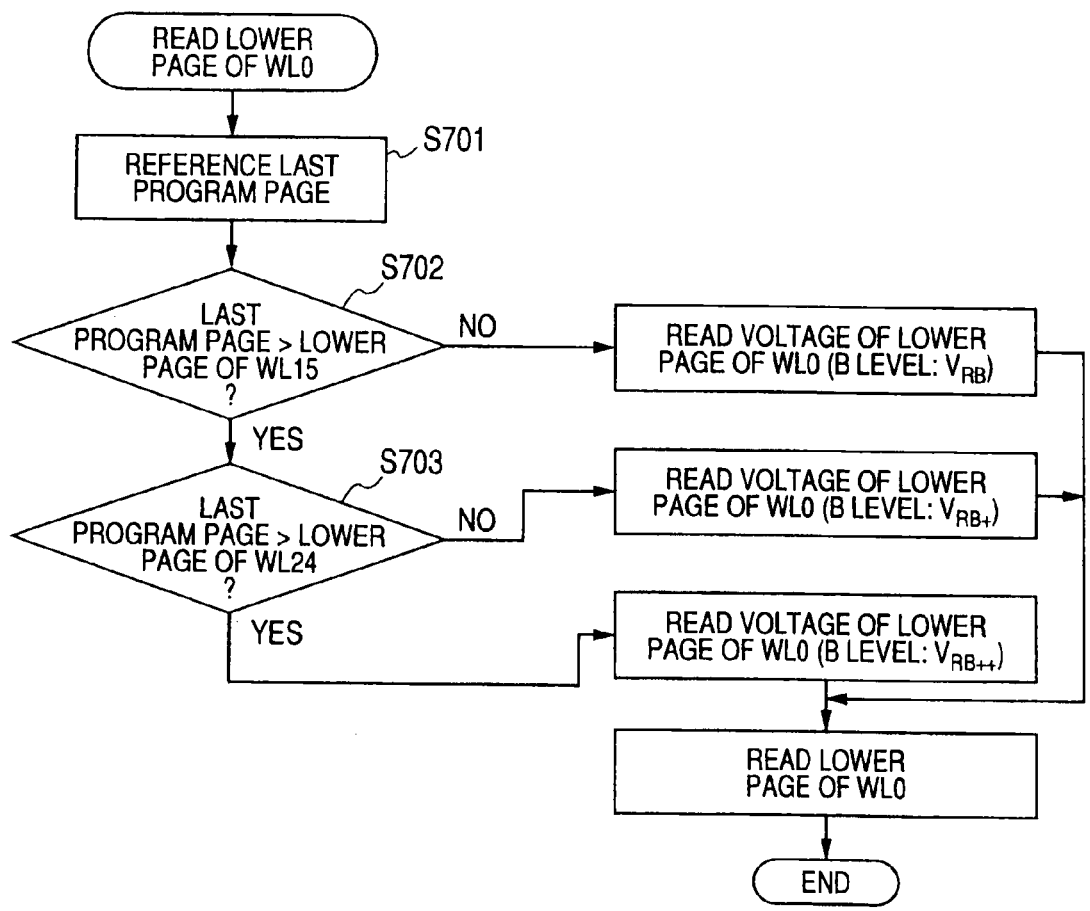
FIG. 28 is an exemplary flow chart showing a computational process performed by an MCU in a modified example of the memory cell allay of the nonvolatile semiconductor memory system according to the first embodiment of the invention.

Next, the read operation of the lower page of word line WL0 in a modified example of the memory cell allay of the nonvolatile semiconductor memory system according to the first embodiment will be described with reference to FIG. 28. FIG. 28 is a flow chart showing the computational process of the MCU 8 during the read operation of the lower page of word line WL0.

First, the last program page stored in the FeRAM 6 is referenced (S701). Thereafter, the read voltage $V_{select}$ is selected by referring the last program page.

Specifically, the last program page is compared with the upper page of word line WL15 (S702). If the last program page is greater than the upper page of word line WL15, that is, if the programming is performed to the page subsequent to the upper page of word line WL15, the third corrected read voltage $V_{RB}$ set for the B level is selected.

Meanwhile, if the last program page is greater than the upper page of word line WL15, that is, if the programming is performed to the page subsequent to the upper page of word line WL15, the last program page is compared with the upper page of word line WL24 (S703). If the last program page is not greater than the upper page of word line WL24, that is, if the programming is not performed to the page subsequent to the upper page of word line WL24, the fifth corrected read voltage $V_{RB+}$ set for the B level is selected.

Meanwhile, if the last program page is greater than the upper page of word line WL24, that is, if the programming is performed to the page subsequent to the upper page of word line WL24, the sixth corrected read voltage $V_{RB++}$ set for the B level is selected.

Figure 29:
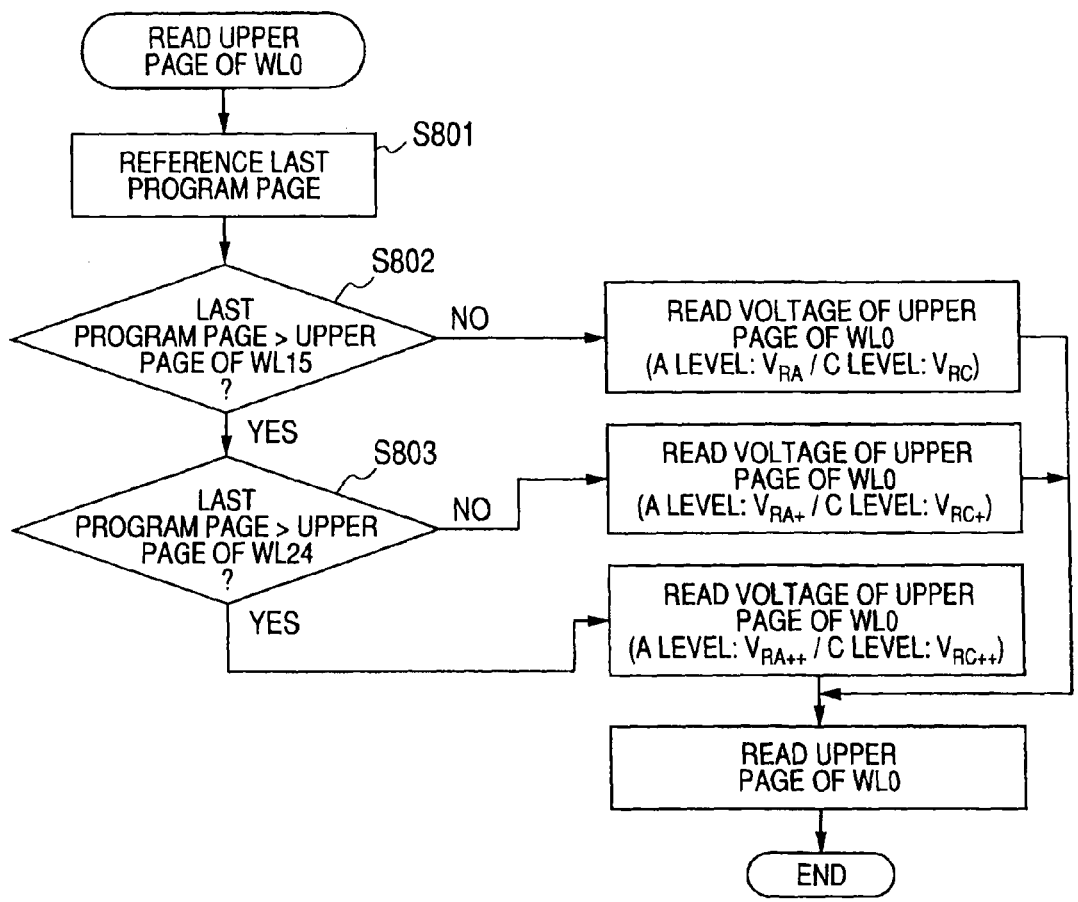
FIG. 29 is an exemplary flow chart showing a computational process performed by an MCU in a modified example of the memory cell allay of the nonvolatile semiconductor memory system according to the first embodiment of the invention.

Next, the read operation of the upper page of word line WL0 in a modified example of the memory cell allay of the nonvolatile semiconductor memory system according to the first embodiment will be described with reference to FIG. 29. FIG. 29 is a flow chart showing the computational process of the MCU 8 during the read operation of the upper page of word line WL0.

First, the last program page stored in the FeRAM 6 is referenced (S801). Thereafter, the read voltage $V_{select}$ is selected by referring the last program page.

Specifically, the last program page is compared with the upper page of word line WL15 (S802). If the last program page is not greater than the upper page of word line WL15, that is, if the programming is not performed to the page subsequent to the upper page of word line WL15, the second corrected read voltage $V_{RA}$ set for the A level and the fourth corrected read voltage $V_{RC}$ set for the C level are selected.

Meanwhile, if the last program page is greater than the upper page of word line WL15, that is, if the programming is performed to the page subsequent to the upper page of word line WL15, the last program page is compared with the upper page of word line WL24 (S803). If the last program page is not greater than the upper page of word line WL24, that is, if the programming is not performed to the page subsequent to the upper page of word line WL24, the second corrected read voltage $V_{RA+}$ set for the A level and the eighth corrected read voltage $V_{RC+}$ set for the C level are selected.

Meanwhile, if the last program page is greater than the upper page of word line WL24, that is, if the programming is performed to the page subsequent to the upper page of word line WL24, the third corrected read voltage $V_{RA++}$ set for the A level and the ninth corrected read voltage $V_{RC++}$ set for the C level are selected.

Second Embodiment

Figure 16:
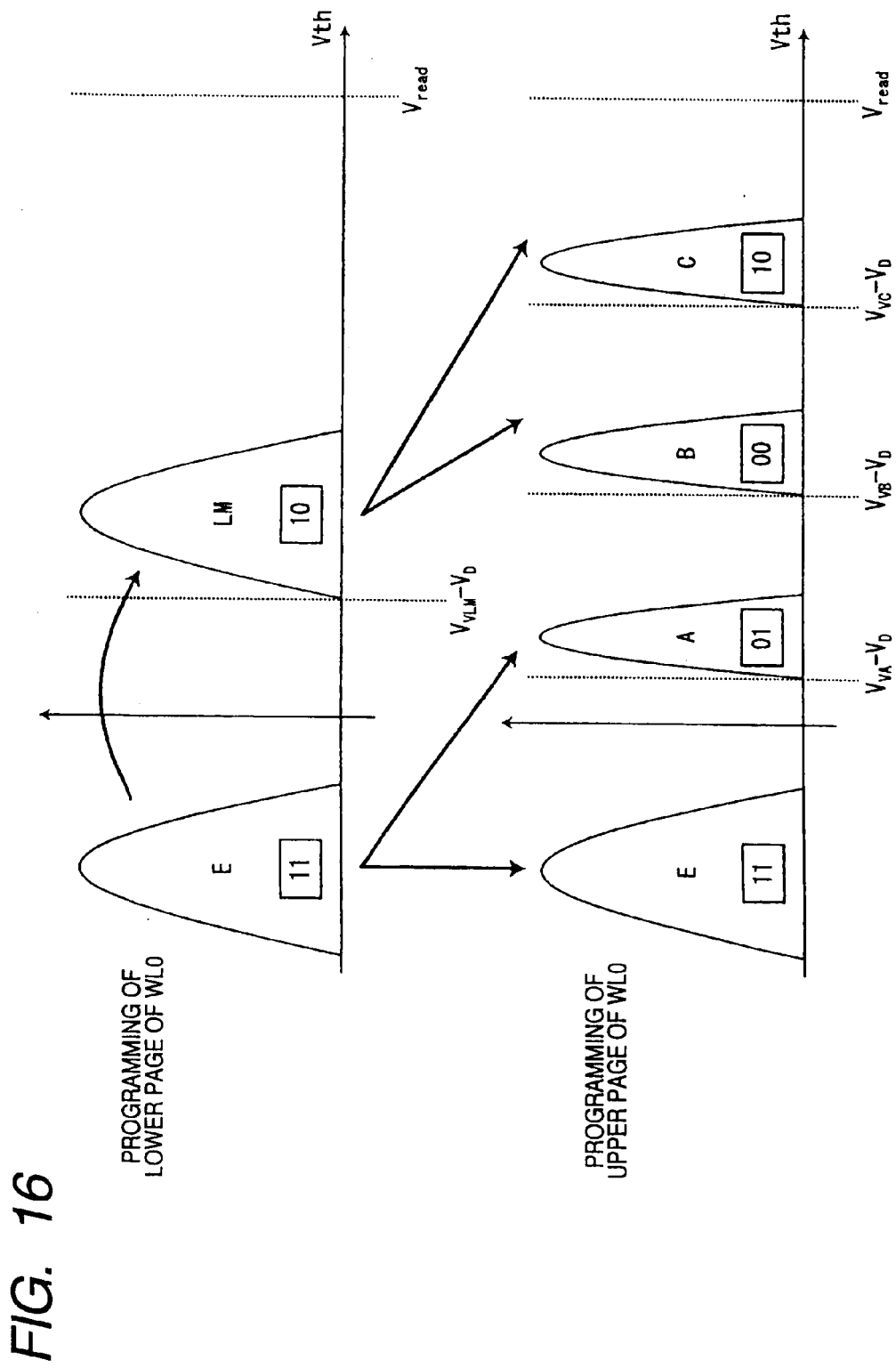
FIG. 16 is an exemplary schematic diagram showing a program operation of a nonvolatile semiconductor memory system according to a second embodiment of the invention.

A data program operation of a memory system according to a second embodiment of the invention will be described with reference to FIG. 16. FIG. 16 is a schematic diagram showing a lower page program operation and an upper page program operation for the memory cell transistor MT0 connected to word line WL0 or the memory cell transistor MT31 connected to word line WL31 in the memory system according to the present embodiment. Hereinafter, components substantially the same as those of the first embodiment will be denoted by the same reference numerals, and only characterizing portions of the present embodiment will be described.

The memory system of the present embodiment is different from that of the first embodiment in that during data program operations for the memory cell transistor MT0 connected to word line WL0 or the memory cell transistor MT31 connected to word line WL31, a verify voltage that defines the threshold voltage lower limit of each data is set lower by $V_D$, considering the effect of the erroneous data programming due to GIDL.

That is, the verify voltage as the threshold voltage lower limit of data "LM", "A", "B", and "C" is set to $V_{VLM}$-$V_D$, $V_{VA}$-$V_D$, $V_{VB}$-$V_D$, and $V_{VC}$-$V_D$, respectively. To cope with the verify voltage of data "LM", "A", "B", and "C" which is set lower by $V_D$, it is preferable to set the threshold voltage upper limit of data "E" (erased state) lower by $V_D$.

Here, $V_D$ is set to a predetermined value that is statistically determined by measuring the amount of shift of the threshold distribution of data stored in the memory cell transistor MT0 connected to word line WL0 or the memory cell transistor MT31 connected to word line WL31 by the effect of the erroneous data programming due to GIDL. The predetermined value is set such that even when the threshold distribution of data "C" is shifted toward higher voltages by the effect of the erroneous data programming due to GIDL, the threshold distribution of data "C" does not exceed the read pass voltage $V_{read}$.

Figure 17:
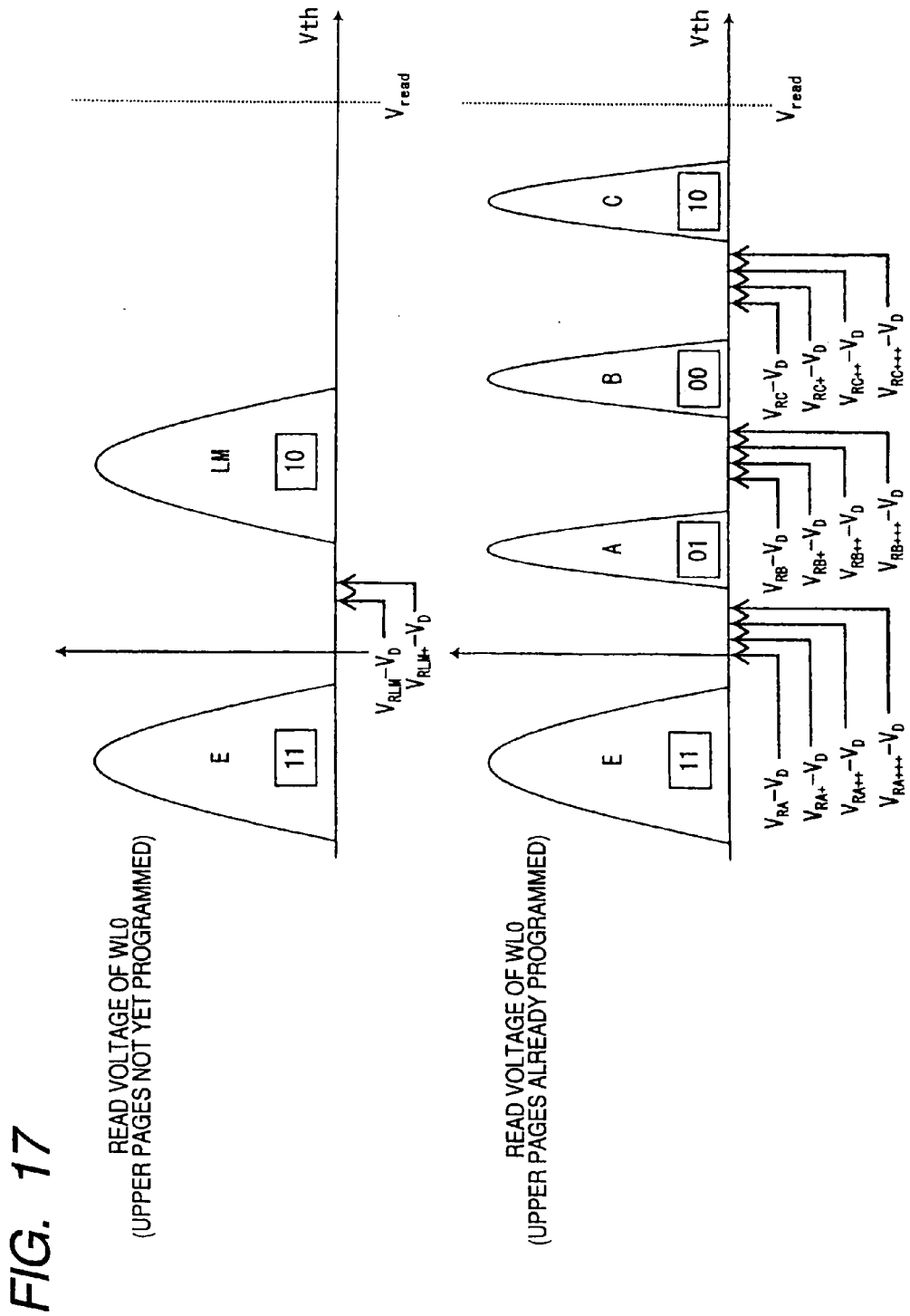
FIG. 17 is an exemplary schematic diagram showing a read voltage of the nonvolatile semiconductor memory system according to the second embodiment of the invention.

To cope with the verify voltage of data "LM", "A", "B", and "C" set lower by $V_D$ than that of the first embodiment, the read voltage $V_{select}$ set for each read level is also set lower by $V_D$. The read operation for reading data stored in the memory cell transistor MT0 connected to word line WL0 will be described with reference to FIG. 17. FIG. 17 is a schematic diagram showing the threshold distribution of data stored in the memory cell transistor MT0 connected to the word line WL0 and the read voltage $V_{select}$ set for each read level.

As shown in FIG. 17, during a read operation when the upper page is not yet programmed, read voltages $V_{RLM-}$-$V_D$, $V_{RLM+}$-$V_D$ are set for the LM level. During a read operation when the upper page is already programmed, read voltages $V_{RA-}$-$V_D$, $V_{RA+}$-$V_D$, $V_{RA++}$-$V_D$, and $V_{RA+++}$-$V_D$ are set for the A level. For the B level, read voltages $V_{RB+}$-$V_D$, $V_{RB++}$-$V_D$, and $V_{RB+++}$-$V_D$ are set. For the C level, read voltages $V_{RC}$-$V_D$, $V_{RC+}$-$V_D$, $V_{RC++}$-$V_D$, and $V_{RC+++}$-$V_D$ are set.

During read operations for reading data stored in the memory cell transistor MT31 connected to word line WL31, the read voltage $V_{select}$ set for each read level is set lower by $V_D$ in a manner similar to the case of word line WL0. Other arrangements are the same as those of the first embodiment.

As described above, in the memory system of the present embodiment, by setting the verify voltage of each data lower by $V_D$, even when the threshold distribution of data "C" having the highest threshold voltage is shifted toward higher voltages by the effect of the erroneous data programming due to GIDL, it is possible to suppress the likelihood of the threshold distribution of data "C" exceeding the read pass voltage $V_{read}$. Accordingly, it is possible to improve the data reliability of a memory system.

In the memory system according to the present embodiment, it has been described for the case in which the verify voltages are set lower by $V_D$, equally for each data. However, the invention is not limited to this, but the verify voltages may be set lower by different values in word lines WL0 and WL31 and for each data.

Third Embodiment

Figure 18:
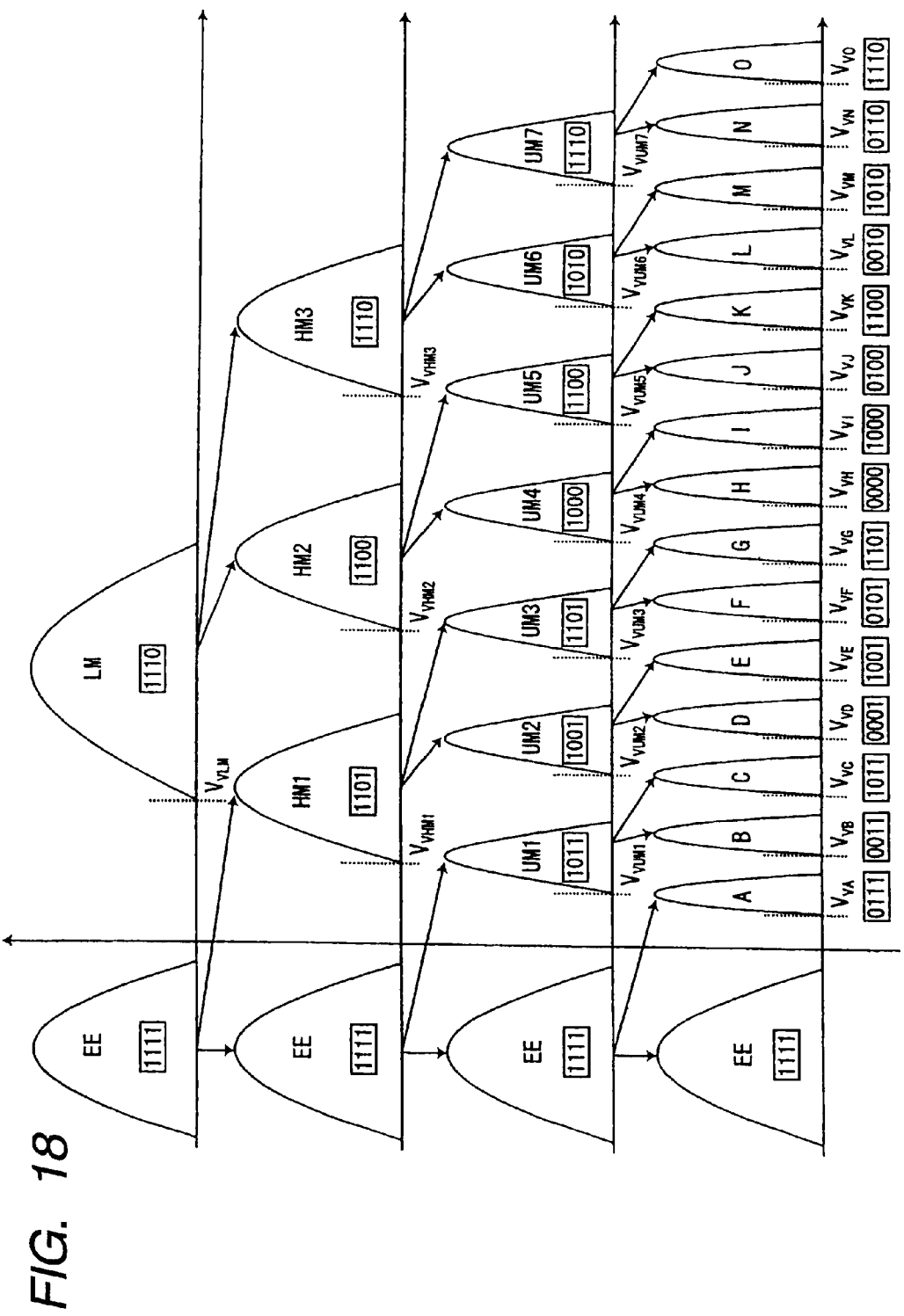
FIG. 18 is an exemplary schematic diagram showing a program operation of a nonvolatile semiconductor memory system according to a third embodiment of the invention.

A data program operation of a memory system according to a third embodiment of the invention will be described with reference to FIG. 18. FIG. 18 is a schematic diagram showing the data program operation of the memory system according to the present embodiment. Hereinafter, components substantially the same as those of the first embodiment will be denoted by the same reference numerals, and only characterizing portions of the present embodiment will be described. The memory system according to the present embodiment is different from that of the first embodiment in that the memory cell transistor MT stores 16-value data depending on a threshold voltage.

Each of the memory cell transistors MT can store one of 16-value data "pqxy" which is defined by first page data "p", second page data "q", third page data "x", and fourth page data "y" and in which in the order of a threshold voltage, data "EE"="1111", data "A"="0111", data "B"="0011", data "C"="1011", data "D"="0001", data "E"="1001", data "F"="0101", data "G"="1101", data "H"="0000", data "I"="1000", data "J"="0100", data "K"="1100", data "L"="0010", data "M"="1010", data "N"="0110", and data "O"="1110" are assigned. Therefore, eight pages are assigned to one word line.

The program operation includes a first page program operation, a second page program operation, a third page program operation, and a fourth page program operation. For one word line WL, the programming is sequentially performed in the order of a first page of the even page, a first page of the odd page, a second page of the even page, a second page of the odd page, a third page of the even page, a third page of the odd page, a fourth page of the even page, and a fourth page of the odd page.

During the first page program operation, first intermediate data "LM" (data "1110") having a threshold distribution ranging between the threshold distribution of second intermediate data "HM1" and the threshold distribution of second intermediate data "HM2" is selectively programmed into the memory cell transistor MT having data "EE" (erased state) stored therein. The first intermediate data "LM" has a threshold voltage lower limit $V_{VLM}$ lower than the threshold voltage lower limit $V_{VHM2}$ of the second intermediate data "HM2" and higher than the threshold voltage lower limit $V_{VHM1}$ of the second intermediate data "HM1" and has a threshold distribution broader than that of second intermediate data "HM3" which corresponds to data "1110" after the second page is programmed.

During the second page program operation, "0" is selectively programmed into the memory cell transistor MT having data "EE" stored therein to program the second intermediate data "HM1" having a threshold voltage lower limit $V_{VHM1}$ having a threshold distribution ranging between the threshold distribution of third intermediate data "UM1" described later and the threshold distribution of third intermediate data "UM2" described later. In addition, "0" is programmed into the memory cell transistor MT having the first intermediate data "LM" having a broad threshold distribution to program the second intermediate data "HM2" having the threshold voltage lower limit $V_{VHM2}$ having a threshold distribution between the threshold distribution of third intermediate data "UM3" described later and the threshold distribution of third intermediate data "UM4" described later. In addition, when programming "1" (i.e., when storing data "1110") into the memory cell transistor MT having the intermediate data "LM" stored therein, the threshold distribution is changed up to the second intermediate data "HM3" having the threshold voltage lower limit $V_{VHM3}$ having a threshold distribution ranging between the threshold distribution of third intermediate data "UM5" described later and the threshold distribution of third intermediate data "UM6" described later.

The second intermediate data "HM1" has a threshold voltage lower limit $V_{VHM1}$ lower than the threshold voltage lower limit $V_{VHM2}$ of the third intermediate data "UM2" and higher than the threshold voltage lower limit $V_{VHM1}$ of the third intermediate data "UM1" and has a threshold distribution broader than that of the third intermediate data "UM3" which corresponds to data "1101" after the third page is programmed.

The second intermediate data "HM2" has a threshold voltage lower limit $V_{VHM2}$ lower than the threshold voltage lower limit $V_{VUM4}$ of the third intermediate data "UM4" and higher than the threshold voltage lower limit $V_{VVM3}$ of the third intermediate data "UM3" and has a threshold distribution broader than that of the third intermediate data "UM5" which corresponds to data "1100" after the third page is programmed.

The second intermediate data "HM3" has a threshold voltage lower limit $V_{VHM3}$ lower than the threshold voltage lower limit $V_{VUM6}$ of the third intermediate data "UM6" and higher than the threshold voltage lower limit $V_{VUM5}$ of the third intermediate data "UM5" and has a threshold distribution broader than that of the third intermediate data "UM7" which corresponds to data "1110" after the third page is programmed.

During the third page program operation, "0" is selectively programmed into the memory cell transistor MT having data "EE" stored therein to program the third intermediate data "UM1" having a threshold voltage lower limit $V_{VUM1}$ having a threshold distribution ranging between the threshold distribution of data "A" and the threshold distribution of data "B". In addition, "0" is programmed into the memory cell transistor MT having the second intermediate data "HM1" having a broad threshold distribution to program the third intermediate data "UM2" having the threshold voltage lower limit $V_{VUM2}$ having a threshold distribution between the threshold distribution of data "C" and the threshold distribution of data "D". In addition, when programming "1" (i.e., when storing data "1101") into the memory cell transistor MT having the second intermediate data "HM1" stored therein, the threshold distribution is changed up to the third intermediate data "UM3" having the threshold voltage lower limit $V_{VHM3}$ having a threshold distribution ranging between the threshold distribution of data "E" and the threshold distribution of data "F".

In addition, when programming "0" into the memory cell transistor MT having the second intermediate data "HM2" having a broad threshold distribution to program the third intermediate data "UM4" having a threshold voltage lower limit $V_{VUM4}$ having a threshold distribution ranging between the threshold distribution of data "G" and the threshold distribution of data "H", and programming "1" (i.e., when storing data "1100") into the memory cell transistor MT having the second intermediate data "HM2" stored therein, the threshold distribution is changed up to the third intermediate data "UM5" having the threshold voltage lower limit $V_{VUM5}$ having a threshold distribution ranging between the threshold distribution of data "I" and the threshold distribution of data "J".

In addition, when programming "0" into the memory cell transistor MT having the second intermediate data "HM3" having a broad threshold distribution to program the third intermediate data "UM6" having a threshold voltage lower limit $V_{VUM6}$ having a threshold distribution ranging between the threshold distribution of data "K" and the threshold distribution of data "L", and programming "1" (i.e., when storing data "1110") into the memory cell transistor MT having the second intermediate data "HM3" stored therein, the threshold distribution is changed up to the third intermediate data "UM7" having the threshold voltage lower limit $V_{VUM7}$ having a threshold distribution ranging between the threshold distribution of data "M" and the threshold distribution of data "N".

The third intermediate data "UM1" has a threshold voltage lower limit $V_{VUM1}$ lower than the threshold voltage lower limit $V_{VB}$ of data "B" and higher than the threshold voltage lower limit $V_{VA}$ of data "A" and has a threshold distribution broader than that of data "C" which corresponds to data "1011" after the fourth page is programmed.

The third intermediate data "UM2" has a threshold voltage lower limit $V_{VUM2}$ lower than the threshold voltage lower limit $V_{VD}$ of data "D" and higher than the threshold voltage lower limit $V_{VC}$ of data "C" and has a threshold distribution broader than that of data "E" which corresponds to data "1001" after the fourth page is programmed.

The third intermediate data "UM3" has a threshold voltage lower limit $V_{VUM3}$ lower than the threshold voltage lower limit $V_{VF}$ of data "F" and higher than the threshold voltage lower limit $V_{VE}$ of data "E" and has a threshold distribution broader than that of data "G" which corresponds to data "1101" after the fourth page is programmed.

The third intermediate data "UM4" has a threshold voltage lower limit $V_{VUM4}$ lower than the threshold voltage lower limit $V_{VH}$ of data "H" and higher than the threshold voltage lower limit $V_{VG}$ of data "G" and has a threshold distribution broader than that of data "I" which corresponds to data "1000" after the fourth page is programmed.

The third intermediate data "UM5" has a threshold voltage lower limit $V_{VUM5}$ lower than the threshold voltage lower limit $V_{VJ}$ of data "J" and higher than the threshold voltage lower limit $V_{VI}$ of data "I" and has a threshold distribution broader than that of data "K" which corresponds to data "1100" after the fourth page is programmed.

The third intermediate data "UM6" has a threshold voltage lower limit $V_{VUM6}$ lower than the threshold voltage lower limit $V_{VL}$ of data "L" and higher than the threshold voltage lower limit $V_{VK}$ of data "K" and has a threshold distribution broader than that of data "M" which corresponds to data "1010" after the fourth page is programmed.

The third intermediate data "UM7" has a threshold voltage lower limit $V_{VUM7}$ lower than the threshold voltage lower limit $V_{VN}$ of data "N" and higher than the threshold voltage lower limit $V_{VM}$ of data "M" and has a threshold distribution broader than that of data "O" which corresponds to data "1110" after the fourth page is programmed.

During the fourth page program operation, "0" is selectively programmed into the memory cell transistor MT having data "EE" stored therein to program data "A" having a threshold voltage lower limit $V_{VA}$. In addition, "0" is programmed into the memory cell transistor MT having the third intermediate data "UM1" having a broad threshold distribution to program data "B" having a threshold voltage lower limit $V_{VB}$. In addition, when programming "1" (i.e., when storing data "1011") into the memory cell transistor MT having the third intermediate data "UM1" stored therein, the threshold distribution is changed up to data "C" having the threshold voltage lower limit $V_{VC}$.

In addition, "0" is programmed into the memory cell transistor MT having the third intermediate data "UM2" having a broad threshold distribution to program data "D" having a threshold voltage lower limit $V_{VD}$. In addition, when programming "1" (i.e., when storing data "1001") into the memory cell transistor MT having the third intermediate data "UM2" stored therein, the threshold distribution is changed up to data "E" having the threshold voltage lower limit $V_{VE}$.

In addition, "0" is programmed into the memory cell transistor MT having the third intermediate data "UM3" having a broad threshold distribution to program data "F" having a threshold voltage lower limit $V_{VF}$. In addition, when programming "1" (i.e., when storing data "1101") into the memory cell transistor MT having the third intermediate data "UM3" stored therein, the threshold distribution is changed up to data "G" having the threshold voltage lower limit $V_{VG}$.

In addition, "0" is programmed into the memory cell transistor MT having the third intermediate data "UM4" having a broad threshold distribution to program data "H" having a threshold voltage lower limit $V_{VH}$. In addition, when programming "1" (i.e., when storing data "1000") into the memory cell transistor MT having the third intermediate data "UM4" stored therein, the threshold distribution is changed up to data "I" having the threshold voltage lower limit $V_{VI}$.

In addition, "0" is programmed into the memory cell transistor MT having the third intermediate data "UM5" having a broad threshold distribution to program data "J" having a threshold voltage lower limit $V_{VJ}$. In addition, when programming "1" (i.e., when storing data "1100") into the memory cell transistor MT having the third intermediate data "UM5" stored therein, the threshold distribution is changed up to data "K" having the threshold voltage lower limit $V_{VK}$.

In addition, "0" is programmed into the memory cell transistor MT having the third intermediate data "UM6" having a broad threshold distribution to program data "L" having a threshold voltage lower limit $V_{VL}$. In addition, when programming "1" (i.e., when storing data "1010") into the memory cell transistor MT having the third intermediate data "UM6" stored therein, the threshold distribution is changed up to data "M" having the threshold voltage lower limit $V_{VM}$.

In addition, "0" is programmed into the memory cell transistor MT having the third intermediate data "UM7" having a broad threshold distribution to program data "N" having a threshold voltage lower limit $V_{VN}$. In addition, when programming "1" (i.e., when storing data "1110") into the memory cell transistor MT having the third intermediate data "UM7" stored therein, the threshold distribution is changed up to data "O" having the threshold voltage lower limit $V_{VO}$.

In the memory system according to the present embodiment, for the memory cell transistors MT connected to word lines WL0 to WL31, common read voltages $V_{RLM}$, $V_{RHM1}$, $V_{RHM2}$, $V_{RHM3}$, $V_{RUM1}$, $V_{RUM2}$, $V_{RUM3}$, $V_{RUM4}$, $V_{RUM5}$, $V_{RUM6}$, $V_{RUM7}$, $V_{RA}$, $V_{RB}$, $V_{RC}$, $V_{RD}$, $V_{RE}$, $V_{RF}$, $V_{RG}$, $V_{RH}$, $V_{RI}$, $V_{RJ}$, $V_{RK}$, $V_{RL}$, $V_{RM}$, $V_{RN}$, and $V_{RO}$ are set for each level for distinguishing between threshold voltages of data in a manner similar to the case of the first embodiment.

Corrected read voltages that are respectively higher than the common read voltages $V_{RLM}$, $V_{RHM1}$, $V_{RHM2}$, $V_{RHM3}$, $V_{RUM1}$, $V_{RUM2}$, $V_{RUM3}$, $V_{RUM4}$, $V_{RUM5}$, $V_{RUM6}$, $V_{RUM7}$, $V_{RA}$, $V_{RB}$, $V_{RC}$, $V_{RD}$, $V_{RE}$, $V_{RF}$, $V_{RG}$, $V_{RH}$, $V_{RI}$, $V_{RJ}$, $V_{RK}$, $V_{RL}$, $V_{RM}$, $V_{RN}$, and $V_{RO}$ are for the word lines WL0 and WL31, in addition to the common read voltages $V_{RLM}$, $V_{RHM1}$, $V_{RHM2}$, $V_{RHM3}$, $V_{RUM1}$, $V_{RUM2}$, $V_{RUM3}$, $V_{RUM4}$, $V_{RUM5}$, $V_{RUM6}$, $V_{RUM7}$, $V_{RA}$, $V_{RB}$, $V_{RC}$, $V_{RD}$, $V_{RE}$, $V_{RF}$, $V_{RG}$, $V_{RH}$, $V_{RI}$, $V_{RJ}$, $V_{RK}$, $V_{RL}$, $V_{RM}$, $V_{RN}$, and $V_{RO}$.

The read voltage $V_{select}$ applied to the word lines WL0 and WL31 is selected by comparing the last program page stored in the FeRAM 6 and the corrected page in a manner similar to the case of the first embodiment. The corrected page is determined in a manner similar to the case of the first embodiment by considering the amount of shift of the threshold distribution of data stored in the memory cell transistor MT to which data is already programmed by the effected of GIDL. For example, during read operations of the first page of the even page of word line WL0, the first page of the odd page of word line WL0, the second page of the odd page of word line WL0, the third page of the odd page of word line WL0, the fourth page of the odd page of the word line WL0, the fourth page of the odd page of word line WL7, the fourth page of the odd page of word line WL15, the fourth page of the odd page of word line WL24, the fourth page of the odd page of word line WL28 are used as the corrected page. Other arrangements are the same as those of the first embodiment.

When the threshold voltage of the memory cell transistor MT is further subdivided, it is necessary to set the gap between threshold distributions of adjacent data smaller. Thus, the effect of the threshold distribution being shifted due to GIDL becomes more prominent, and it is thus very important to correct the read voltage $V_{select}$.

As described in the memory system according to the present embodiment, the correction of the read voltage $V_{select}$ in the memory system according to the first embodiment can be applied to the memory cell transistor MT capable of storing 16-value data without being limited to the memory cell transistor MT capable of storing 4-value data, based on the same technical concept. That is, the correction of the read voltage $V_{select}$ in the memory system according to the first embodiment can be applied to the memory cell transistor MT capable of storing N-value data (N=2, 4, 8, 16, . . . , and so on), without regard to the number of data the memory cell transistor MT can store.

As described in the memory system according to the present embodiment, the data "11", which represents erased condition, is set so that the data has a negative threshold voltage. Assuming that the multiple value control is more finely done using 8-values or 16-values as the threshold voltage, the margin between $V_{read}$ and the data having the largest threshold voltage might become insufficient. In such a case, a negative threshold voltage level may be set to the data having a second lowest threshold voltage level next to the erased condition. When such a negative threshold voltage level is set to the data other than the erased condition, the read voltage $V_{select}$ may be 0[V] or lower.

Fourth Embodiment

Figure 19:
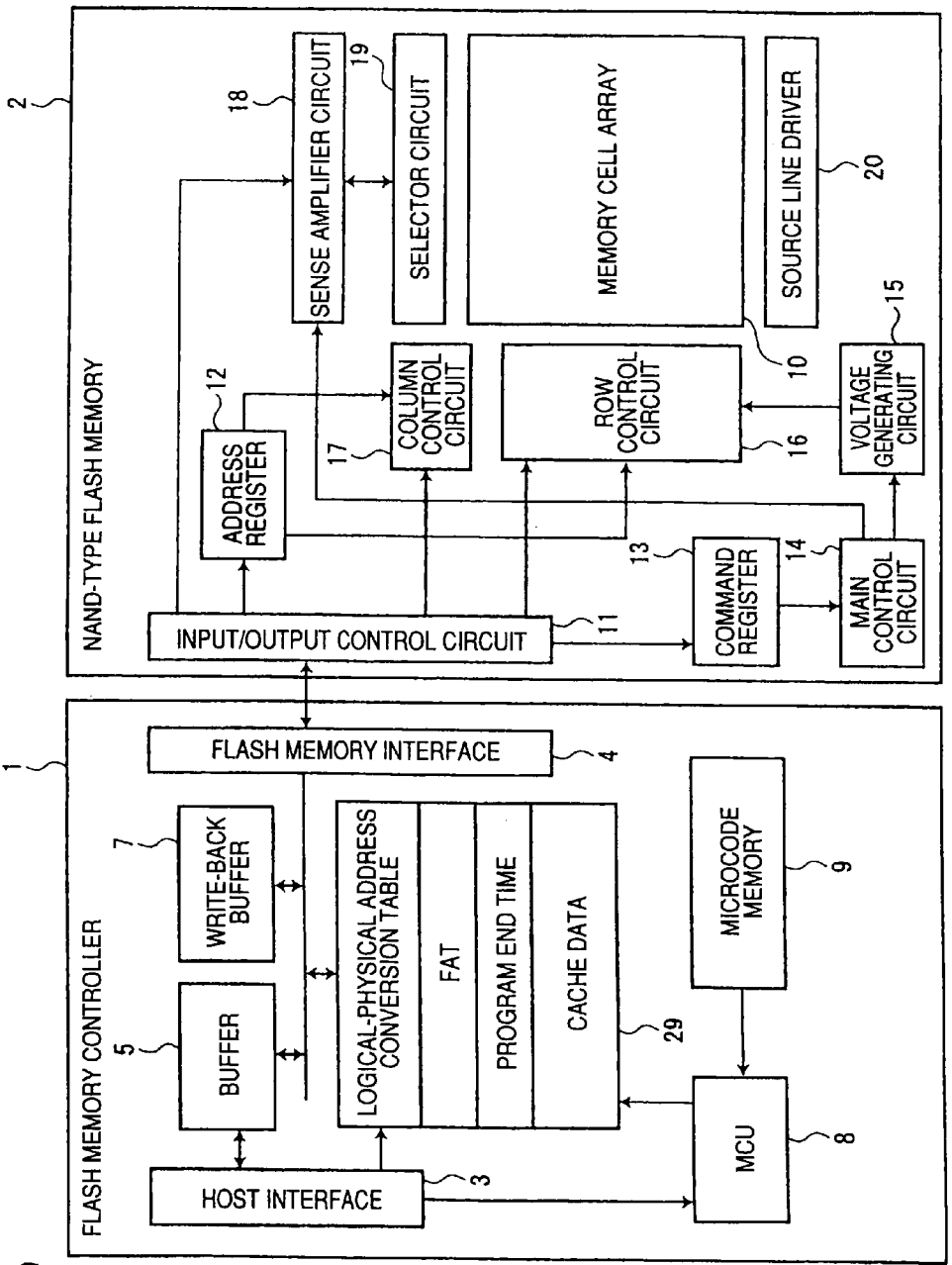
FIG. 19 is an exemplary block diagram showing the arrangement of a nonvolatile semiconductor memory system according to a fourth embodiment of the invention.

The arrangement of a memory system according to a fourth embodiment of the invention will be described with reference to FIG. 19. FIG. 19 is a block diagram showing the arrangement of the memory system according to the fourth embodiment. Hereinafter, components substantially the same as those of the first embodiment will be denoted by the same reference numerals, and only characterizing portions of the present embodiment will be described.

In the NAND-type flash memory 2, electrons injected into the floating gate electrode FG leak gradually as the data storage time increases, thus gradually lowering the threshold voltage of the memory cell transistor MT which is already programmed. Such a phenomenon becomes prominent as the size of the memory cell transistor MT decreases.

Considering such a phenomenon, in the memory system according to the present embodiment, a program end time $t_1$ described later for each block BLK is stored in the FeRAM 29, and the read voltage $V_{select}$ applied to the word lines WL0 to WL31 of each block BLK is corrected in accordance with the program end time $t_1$. Other arrangements are the same as those of the first embodiment.

Storing the program end time $t_1$ of each block BLK in the FeRAM 29 means that the last time at which data is programmed in each block BLK, i.e., the time at which data is programmed to the last program page of each block BLK, is stored in the FeRAM 29. The program end time $t_1$ is input from the outside of the memory system to the memory controller 1 and is updated whenever data is programmed in each block BLK.

Figure 20:
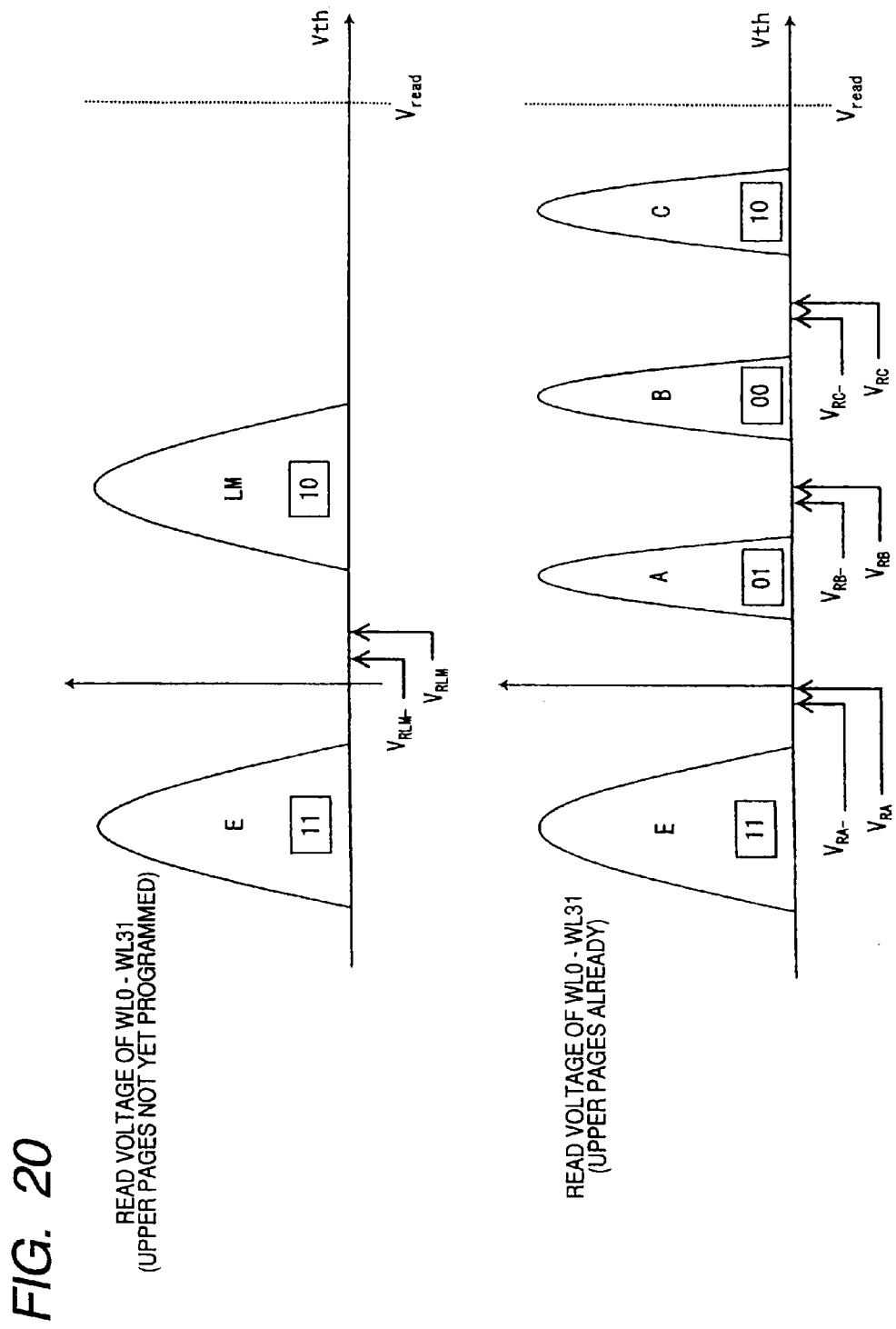
FIG. 20 is an exemplary schematic diagram showing a read voltage of the nonvolatile semiconductor memory system according to the fourth embodiment of the invention.

The read voltage $V_{select}$ applied to word lines WL0 to WL31 will be described with reference to FIG. 20. FIG. 20 is a schematic diagram showing the threshold distribution of data stored in the memory cell transistors MT connected to word lines WL0 to WL31 and the read voltage $V_{select}$ set for each read level.

As shown in FIG. 20, during a read operation when the upper page is not yet programmed, the first common read voltage $V_{RLM}$ is set for the LM level. During a read operation when the upper page is already programmed, the second, third, and fourth common read voltages $V_{RA}$, $V_{RB}$, and $V_{RC}$ are set for the A, B, and C levels, respectively.

Considering the amount of shift of the threshold distribution of data stored in the memory cell transistor MT, to which data programming is already performed, toward higher voltages with time, a fifteenth corrected read voltage $V_{RLM}$, lower than the first common read voltage $V_{RLM}$ is set for the LM level; a sixteenth corrected read voltage $V_{RA}$, lower than the second common read voltage $V_{RA}$ is set for the A level; a seventeenth corrected read voltage $V_{RB}$, lower than the third common read voltage $V_{RB}$ is set for the B level; and an eighteenth corrected read voltage $V_{RC}$, lower than the fourth common read voltage $V_{RC}$ is set for the C level.

In the memory system according to the present embodiment, the read voltage $V_{select}$ is selected by comparing the above-described program end time $t_1$ for each block BLK and a read start time $t_2$. The read start time $t_2$ is input from the outside of the memory system to the memory controller 1 and is automatically referenced when a read command is input to the memory controller 1.

Figure 21:
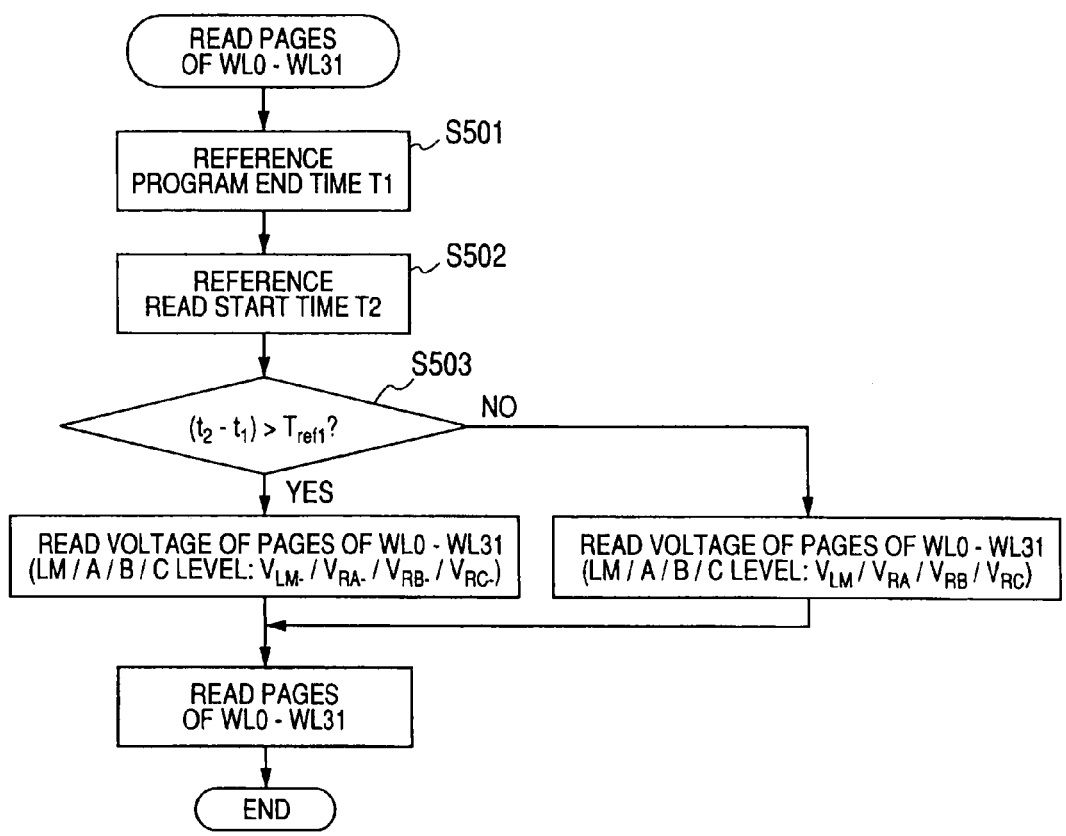
FIG. 21 is an exemplary flow chart showing a computational process performed by an MCU in the nonvolatile semiconductor memory system according to the fourth embodiment of the invention.

FIG. 21 is a flow chart showing the computational process of the MCU 8 when the memory controller 1 having the read command received therein selects the read voltage $V_{select}$.

First, at the start of the read operations for reading pages of word lines WL0 to WL31, the program end time $t_1$ of the block BLK that includes the word lines WL0 to WL31 is referenced from the FeRAM 29 (S501). Next, the read start time $t_2$ is referenced (S502).

Then the program end time $t_1$ is compared with the read start time $t_2$ (S503). If $t_2-t_1$ is not greater than a first reference time $T_{ref1}$, the first, second, third, and fourth common read voltages $V_{RLM}$, $V_{RA}$, $V_{RB}$, and $V_{RC}$ are selected, and a read command instructing a data read operation using the first, second, third, and fourth common read voltages $V_{RLM}$, $V_{RA}$, $V_{RB}$, and $V_{RC}$ is input to the NAND-type flash memory 2.

Meanwhile, if $t_2-t_1$ is greater than a first reference time $T_{ref1}$, since the threshold distribution of data stored in the memory cell transistor MT is shifted toward higher voltages, the fifteenth, sixteenth, seventeenth, and eighteenth corrected read voltages $V_{LM-}$, $V_{RA-}$, $V_{RB-}$, and $V_{RC-}$, which in each read level, are respectively lower than the first, second, third, and fourth common read voltages $V_{RLM}$, $V_{RA}$, $V_{RB}$, and $V_{RC}$ are selected, and a read command instructing a data read operation using the fifteenth, sixteenth, seventeenth, and eighteenth corrected read voltages $V_{LM-}$, $V_{RA-}$, $V_{RB-}$, and $V_{RC-}$ is input to the NAND-type flash memory 2.

In the present embodiment, although only the read voltage $V_{select}$ having one correction step is illustrated, by setting a plurality of reference times in addition to the first reference time $T_{ref1}$, it is possible to correct the read voltage to have greater correction steps. The reference time is a predetermined time that is statistically determined by measuring the data storage characteristics of the memory cell transistor MT.

The fifteenth to eighteenth corrected read voltages are set to predetermined values that are statistically determined by measuring the amount of shift of the threshold distribution of data stored in the memory cell transistors MT connected to the word lines WL0 to WL31 toward higher voltages at the end of the first reference time $T_{ref1}$. These corrected read voltages are preferably set so as to maintain predetermined voltage difference between the first, second, third, and fourth common read voltages $V_{RLM}$, $V_{RA}$, $V_{RB}$, and $V_{RC}$ in each read level and the threshold voltage lower limits $V_{VLM}$, $V_{VA}$, $V_{VB}$, and $V_{VC}$ of each data.

In the memory system according to the present embodiment, at the time of starting the memory system, the program end time $t_1$ of each block BLK and the start time $t_3$ of the memory system are compared with each other, and for the block BLK in which the data storage time exceeds the second reference time $T_{ref2}$, data stored in the corresponding block BLK is copied to other block different from the corresponding block BLK. The second reference time $T_{ref2}$ is a predetermined time that is statistically determined by measuring the data storage characteristics of the memory cell transistor MT. Each time may be obtained from outside of the memory system, also may be measured by the controller.

Figure 22:
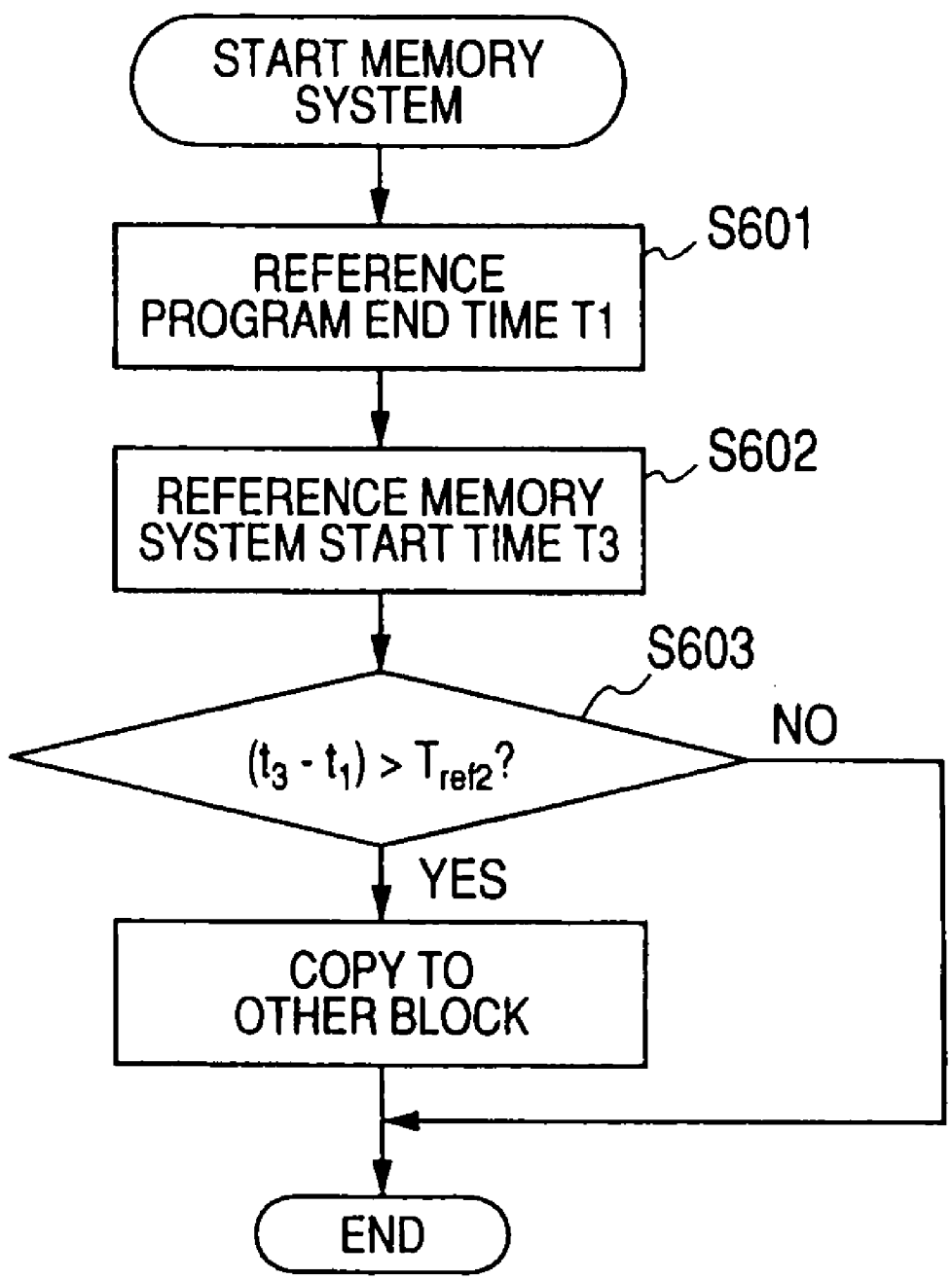
FIG. 22 is an exemplary flow chart showing a computational process performed by an MCU in the nonvolatile semiconductor memory system according to the fourth embodiment of the invention.

FIG. 22 is a flow chart showing the computational process of the MCU 8 at the time of starting the memory system. At the time of starting the memory system, the program end time $t_1$ of each block BLK is read out from the FeRAM 29 (S601). Next, a memory system start time $t_3$ is read out (S602).

The program end time $t_1$ and the memory system start time $t_3$ are compared with each other (S603), and for a block BLK, in which $t_3-t_1$ is greater than the second reference time $T_{ref2}$, the data stored in the corresponding block BLK is copied to other block BLK different from the corresponding block BLK. If $t_3-t_1$ is not greater than the second reference time $T_{ref2}$, the process enters a command waiting state.

The program end time $t_1$ of each block BLK stored in the FeRAM 29 may be stored in units of any one of year, month, day, and hour. Alternatively, rather than using the program end time $t_1$ of each block BLK, the program end time for each page in the block BLK may be stored in the FeRAM 29, and the read voltage $V_{select}$ may be corrected for each word line WL in accordance with the program end time of each page.

Since the program end time $t_1$ is frequently rewritten, the program end time $t_1$ is preferably stored in nonvolatile semiconductor memories such as the FeRAM 29, in which the upper limit of the number of rewritings is high, and capable of operating at higher speed.

Without being limited to the time of starting the memory system, data stored in a block BLK, in which a third reference time $T_{ref3}$ has been elapsed after the memory system is started, may be copied to other block BLK different from the corresponding block.

The number of erasings and the number of programmings of each block BLK may be stored in the FeRAM 29. As the number of erasings and programmings increases, the performance of the memory cell transistor MT may deteriorate, thus causing the threshold distribution at the outskirts to spread or varying the threshold voltage. For this reason, the read voltage $V_{select}$ applied to the word line WL is corrected in accordance with the number of erasings or programmings in the block, and the read operation is performed using the corrected read voltage. Accordingly, it is possible to improve the reliability of the memory system.

The last program page may be stored in the FeRAM 29 in a manner similar to the case of the first embodiment. In this case, the read voltage $V_{select}$ applied to the word line WL is corrected considering the amount of shift of the threshold voltage of data stored in the memory cell transistors MT connected to the word lines WL0 to WL31 toward higher voltages with time and the amount of shift of the threshold voltage of data stored in the memory cell transistors MT connected to the word lines WL0 and WL31 by the effect of the erroneous data programming due to GIDL.

Fifth Embodiment

Figure 23:
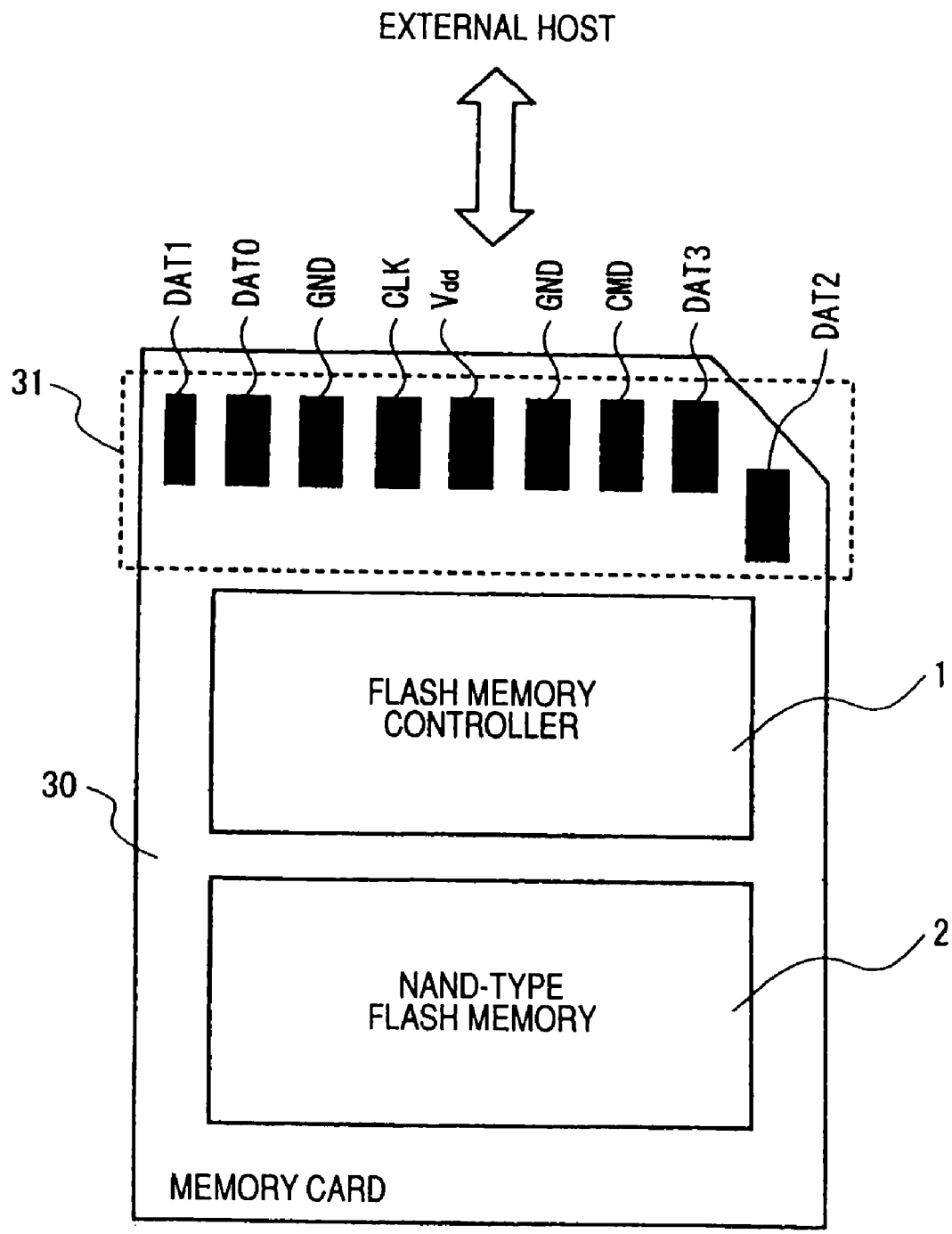
FIG. 23 is an exemplary block diagram showing the arrangement of a memory card according to a fifth embodiment of the invention.

FIG. 23 is a block diagram showing the arrangement of a memory card 30 according to the present embodiment. The memory card 30 according to the present embodiment includes the memory system according to the first to fourth embodiments.

The memory card 30 is formed like the SD™ memory card having nine terminals and is used as an external memory device for a host device (not shown). Specifically, the host device can be one of various kinds of electronic devices, such as a personal computer, PDA, a digital still camera, or a portable phone, that process various kinds of data such as image data, music data or ID data.

An interface signal terminal 31 includes a total of nine signal terminals, i.e., a CLK terminal used to transmit clocks from the host device to the memory card 30, a CMD terminal used to transmit commands and responses to the commands, DAT0, DAT1, DAT2, and DAT3 terminals used as input/output terminals for read/write data, a VDD terminal used to supply power, and two GND terminals for grounding.

These nine signal terminals are electrically connected to a host interface of the host device so the commands, addresses, and data are transmitted and received.

Sixth Embodiment

Figure 24:
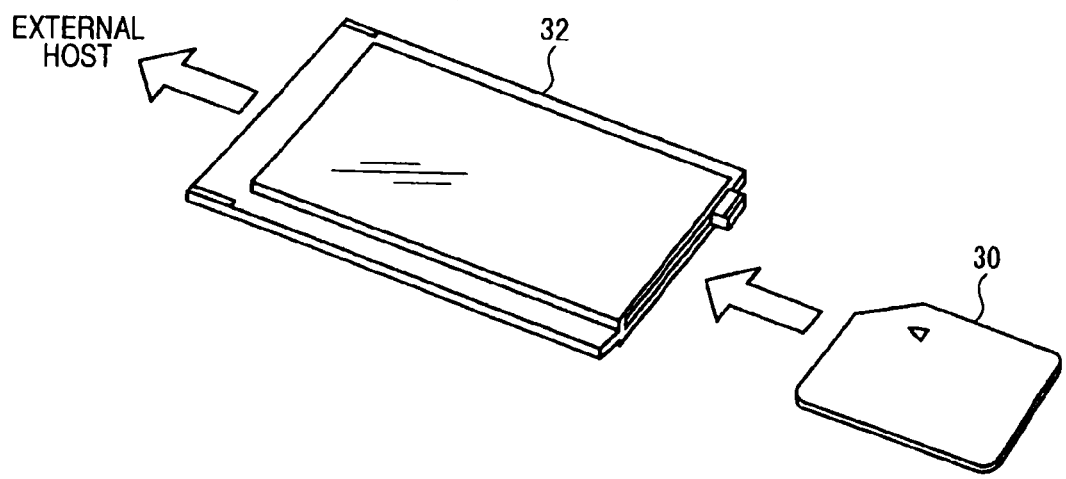
FIG. 24 is an exemplary schematic diagram showing a memory card holder according to a sixth embodiment of the invention.

FIG. 24 is a schematic diagram showing a memory card holder 32 according to the present embodiment. The memory card 30 according to the fifth embodiment can be inserted into the memory card holder 32 shown in FIG. 24. The memory card holder 32 is connected to a host device (not shown) and serves as an interface device between the memory card 30 and the host device.

Seventh Embodiment

Figure 25:
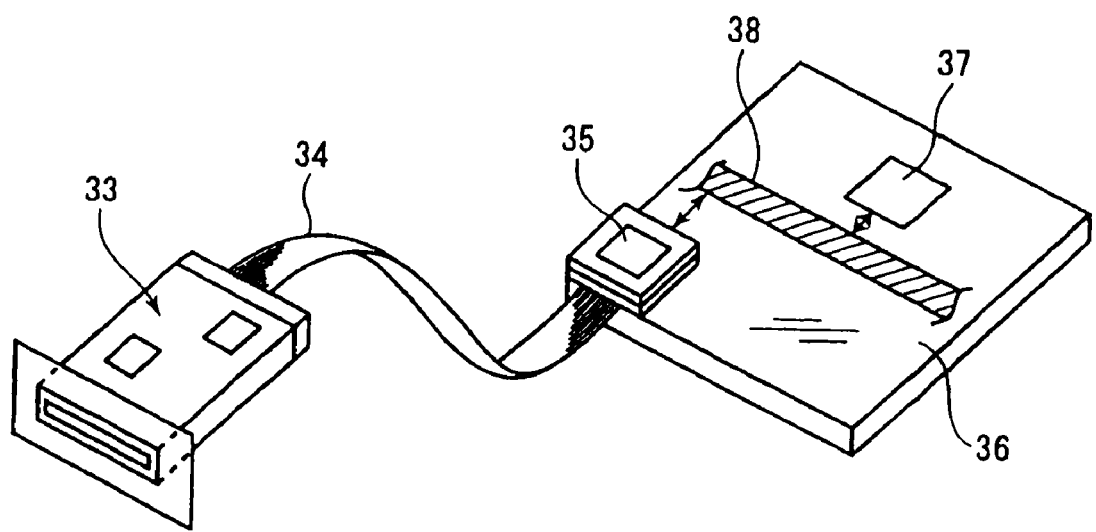
FIG. 25 is an exemplary schematic diagram showing a connector device according to a seventh embodiment of the invention.

FIG. 25 shows a connector device 33 which can receive any one of the memory card 30 according to the fifth embodiment and the memory card holder 32 according to the sixth embodiment. The memory card 30 or the memory card holder 32 is electrically connected to the connector device 33 by being mounted on the connector device 33. The connector device 33 is connected to a board 36 via a connection wire 34 and an interface circuit 35. The board 36 has a CPU (Central Processing Unit) 37 and a bus 38 mounted thereon.

Figure 26:
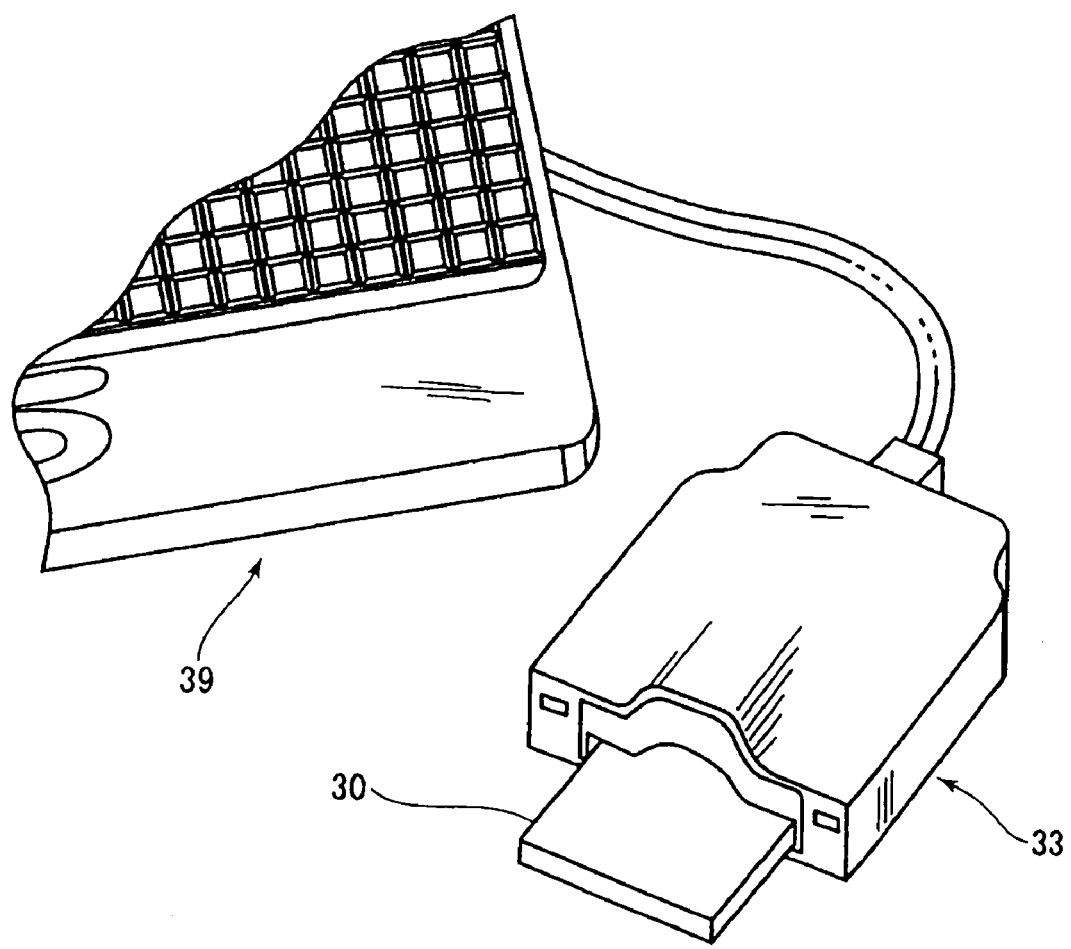
FIG. 26 is an exemplary schematic diagram showing the connector device according to the seventh embodiment of the invention.

As shown in FIG. 26, the memory card 30 or the memory card holder 32 may be inserted into the connector device 33, and the connector device 33 may be connected to a PC 39 via the connection wire 34.

As described with reference to the embodiment, there is provided a nonvolatile semiconductor memory, a control method of the nonvolatile semiconductor memory, a nonvolatile semiconductor memory system, and a memory card, capable of maintaining a high degree of data reliability even with the subdivision of the threshold voltage and with the decrease in the size of the memory cell.

What is claimed is:

1. A memory system comprising:
a nonvolatile semiconductor memory including a plurality of blocks, each of the plurality of blocks being a unit of data erasing;
a volatile semiconductor memory being capable of storing elapsed time from data writing in one of the plurality of blocks; and
a controller configured to issue a first read command applying a first read voltage when the elapsed time of the block is less than a threshold and issue a second read command applying a second read voltage when the elapsed time of the block is not less than the threshold, wherein
the nonvolatile semiconductor memory uses a verify voltage and the first read voltage when the elapsed time of the block is less than the threshold and uses the same verify voltage and the second read voltage when the elapsed time of the block is not less than the threshold.

2. The memory system according to claim 1, wherein the first read voltage is different from the second read voltage.

3. The memory system according to claim 1, wherein the first read voltage is higher than the second read voltage.

4. The memory system according to claim 1, wherein the first read voltage is lower than the second read voltage.

5. The memory system according to claim 1, wherein the volatile semiconductor memory is DRAM and the nonvolatile semiconductor memory is NAND flash memory.

6. The memory system according to claim 1, wherein the volatile semiconductor memory is SRAM and the nonvolatile semiconductor memory is NAND flash memory.

7. The memory system according to claim 1, wherein the volatile semiconductor memory is capable of storing a mapping table which indicates a relationship between logical addresses and physical addresses of the nonvolatile semiconductor memory.

8. The memory system according to claim 1, wherein the volatile semiconductor memory is capable of storing a FAT (File Allocation Table) related with data stored in the nonvolatile semiconductor memory.

9. The memory system according to claim 1, wherein the nonvolatile semiconductor memory includes a plurality of memory cells and each of the plurality of memory cells is capable of storing multiple bits.

10. A memory system comprising:
a first nonvolatile semiconductor memory including a plurality of blocks, each of the plurality of blocks being a unit of data erasing;
a second nonvolatile semiconductor memory being capable of storing elapsed time from data writing in one of the plurality of blocks; and
a controller configured to issue a first read command applying a first read voltage when the elapsed time of the block is less than a threshold and issue a second read command applying a second read voltage when the elapsed time of the block is not less than the threshold, wherein
the first nonvolatile semiconductor memory uses a verify voltage and the first read voltage when the elapsed time of the block is less than the threshold and uses the same verify voltage and the second read voltage when the elapsed time of the block is not less than the threshold.

11. The memory system according to claim 10, wherein the first read voltage is different from the second read voltage.

12. The memory system according to claim 10, wherein the first read voltage is higher than the second read voltage.

13. The memory system according to claim 10, wherein the first read voltage is lower than the second read voltage.

14. The memory system according to claim 10, wherein the first nonvolatile semiconductor memory is NAND flash memory and the second nonvolatile semiconductor memory is FeRAM.

15. The memory system according to claim 10, wherein the first nonvolatile semiconductor memory is NAND flash memory and the second nonvolatile semiconductor memory is MRAM.

16. The memory system according to claim 10, wherein the second nonvolatile semiconductor memory is capable of storing a mapping table which indicates a relationship between logical addresses and physical addresses of the first nonvolatile semiconductor memory.

17. The memory system according to claim 10, wherein the first nonvolatile semiconductor memory is capable of storing a FAT (File Allocation Table) related with data stored in the second nonvolatile semiconductor memory.

18. The memory system according to claim 10, wherein the second nonvolatile semiconductor memory includes a plurality of memory cells and each of the plurality of memory cells is capable of storing multiple bits.

* * * * *